(12) United States Patent
Walker

(10) Patent No.: US 11,949,408 B2
(45) Date of Patent: Apr. 2, 2024

(54) TEMPERATURE SENSOR CIRCUITS FOR INTEGRATED CIRCUIT DEVICES

(71) Applicant: Mavagail Technology, LLC, San Jose, CA (US)

(72) Inventor: Darryl G. Walker, San Jose, CA (US)

(73) Assignee: Mavagail Technology, LLC, San Jose, CA (US)

( * ) Notice: Subject to any disclaimer, the term of this patent is extended or adjusted under 35 U.S.C. 154(b) by 0 days.

(21) Appl. No.: 18/133,145

(22) Filed: Apr. 11, 2023

(65) Prior Publication Data

US 2023/0246641 A1 Aug. 3, 2023

Related U.S. Application Data

(63) Continuation of application No. 17/745,991, filed on May 17, 2022, now Pat. No. 11,689,198, which is a
(Continued)

(51) Int. Cl.
*H03K 17/14* (2006.01)
*G01K 1/14* (2021.01)
(Continued)

(52) U.S. Cl.
CPC ............. *H03K 17/145* (2013.01); *G01K 1/14* (2013.01); *G01K 3/005* (2013.01); *G01K 7/01* (2013.01);
(Continued)

(58) Field of Classification Search
CPC ........ H03K 17/145; G01K 1/14; G01K 3/005; G01K 7/01; G05F 3/265; G06F 1/08;
(Continued)

(56) References Cited

U.S. PATENT DOCUMENTS 9,194,754 B2 11/2015 Walker
9,286,991 B1 * 3/2016 Walker ................... H01L 22/10
(Continued)

OTHER PUBLICATIONS

U.S. Appl. No. 63/029,598, filed May 25, 2020, to which the present application claims priority.
(Continued)

*Primary Examiner* — Jung Kim

(57) ABSTRACT

An integrated circuit device having insulated gate field effect transistors (IGFETs) having a plurality of horizontally disposed channels that can be vertically aligned above a substrate with each channel being surrounded by a gate structure has been disclosed. The integrated circuit device may include a temperature sensor circuit and core circuitry. The temperature sensor circuit may include at least one portion formed in a region other than the region that the IGFETs are formed as well as at least another portion formed in the region that the IGFETs having a plurality of horizontally disposed channels that can be vertically aligned above a substrate with each channel being surrounded by a gate structure are formed. By forming a portion of the temperature sensor circuit in regions below the IGFETs, an older process technology may be used and device size may be decreased and cost may be reduced.

20 Claims, 10 Drawing Sheets

Related U.S. Application Data continuation of application No. 17/313,299, filed on May 6, 2021, now Pat. No. 11,381,235.

(60) Provisional application No. 63/029,598, filed on May 25, 2020.

(51) Int. Cl.

| | |
|---|---|
| *G01K 3/00* | (2006.01) |
| *G01K 7/01* | (2006.01) |
| *G05F 3/26* | (2006.01) |
| *G06F 1/08* | (2006.01) |
| *G11C 11/402* | (2006.01) |
| *G11C 11/406* | (2006.01) |
| *G11C 11/419* | (2006.01) |
| *H01L 23/34* | (2006.01) |
| *H01L 27/092* | (2006.01) |
| *H01L 29/06* | (2006.01) |
| *H01L 29/423* | (2006.01) |
| *H01L 29/786* | (2006.01) |

(52) U.S. Cl.
CPC ............... *G05F 3/265* (2013.01); *G06F 1/08* (2013.01); *G11C 11/4026* (2013.01); *G11C 11/40626* (2013.01); *G11C 11/419* (2013.01); *H01L 23/34* (2013.01); *H01L 27/092* (2013.01); *H01L 29/0665* (2013.01); *H01L 29/42392* (2013.01); *H01L 29/78696* (2013.01)

(58) Field of Classification Search
CPC . G11C 11/40626; G11C 11/419; G11C 5/145; G11C 5/147; G11C 7/04; G11C 11/4074; G11C 11/417; H01L 23/34; H01L 27/092; H01L 29/0665; H01L 29/42392; H01L 29/78696; H01L 29/775; H01L 29/0673; B82Y 10/00

See application file for complete search history.

(56) References Cited

U.S. PATENT DOCUMENTS

| | | |
|---|---|---|
| 10,132,696 B2 | 11/2018 | Kiep |
| 11,381,235 B2 | 7/2022 | Walker |
| 11,515,871 B2 | 11/2022 | Walker |
| 2006/0139089 A1 | 6/2006 | Bambridge |
| 2021/0366803 A1 | 11/2021 | Walker |
| 2021/0366804 A1 | 11/2021 | Walker |
| 2021/0367591 A1 | 11/2021 | Walker |
| 2022/0278678 A1 | 9/2022 | Walker |

OTHER PUBLICATIONS

U.S. Appl. No. 17/313,299, filed May 6, 2021, to which the present application claims priority.
U.S. Appl. No. 17/745,991, filed May 17, 2022, to which the present application claims priority.
Office Action, dated Mar. 29, 2023, for U.S. Appl. No. 17/973,926, filed Oct. 26, 2022.

* cited by examiner

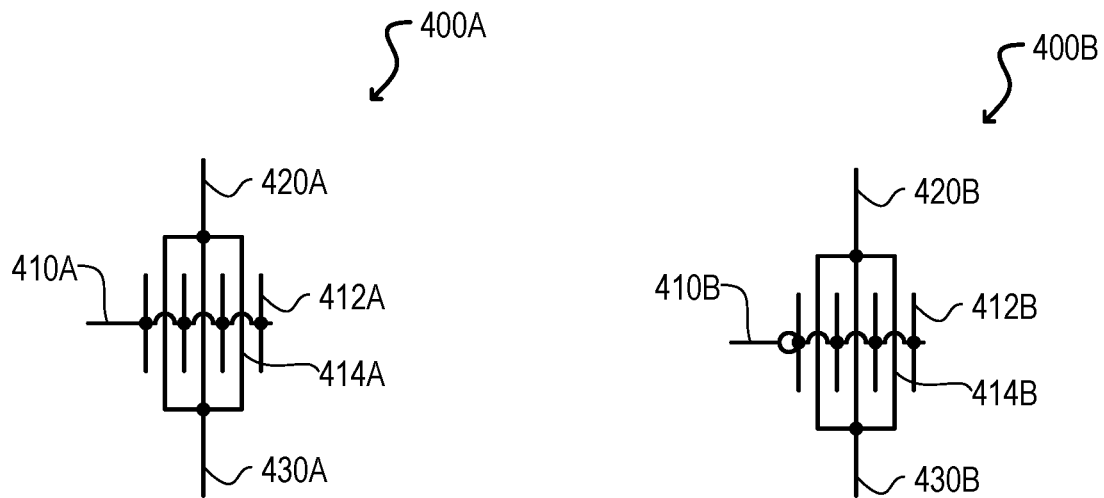
FIG. 4A
FIG. 4B
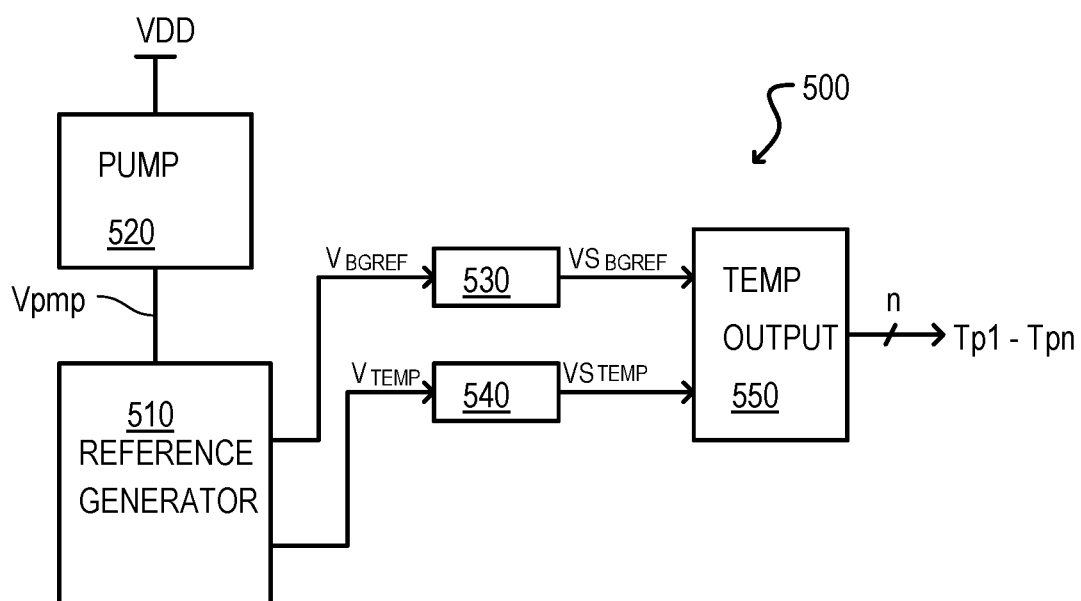
FIG. 5

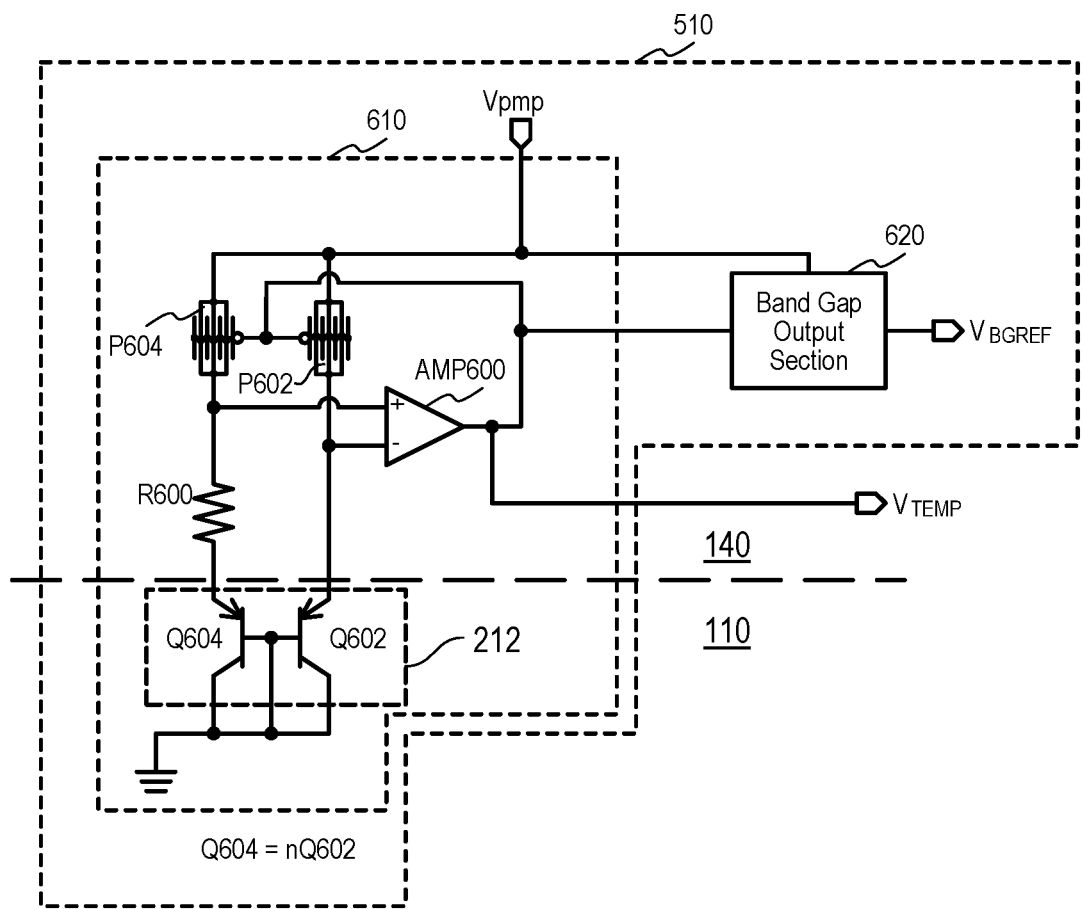
FIG. 6
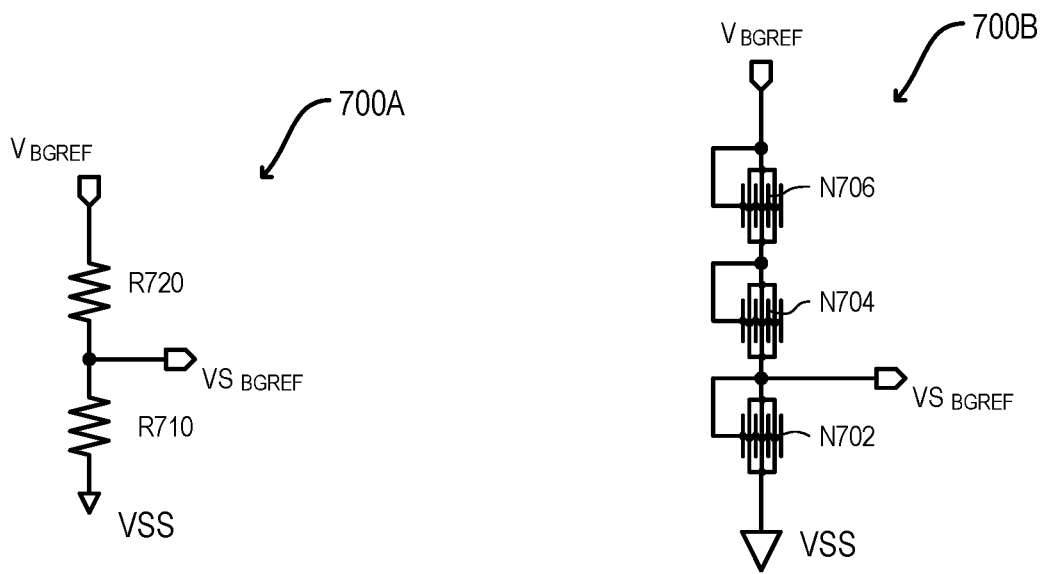
FIG. 7A
FIG. 7B

TEMPERATURE SENSOR CIRCUITS FOR INTEGRATED CIRCUIT DEVICES

This application is a continuation of U.S. patent application Ser. No. 17/745,991 filed May 17, 2022, issued as U.S. Pat. No. 11,689,198 on Jun. 27, 2023, which is a continuation of U.S. patent application Ser. No. 17/313,299 filed May 6, 2021, now U.S. Pat. No. 11,381,235, which claims the benefit of U.S. Provisional Patent Application Ser. No. 63/029,598, filed May 25, 2020, the contents all of which are incorporated by reference herein.

TECHNICAL FIELD

The present invention relates generally to an integrated circuit (IC) device, and more particularly to improving temperature sensing for an IC device.

BACKGROUND OF THE INVENTION

As transistor sizes get smaller and operating voltages become lower, temperature sensor circuits may not operate and if the operating voltage of the temperature sensor increases, the transistors may have integrity problems due to high voltage stress. Furthermore, temperature sensor circuit structures may be incompatible with new technology and/or consume too much of the active footprint of an integrated circuit device.

In light of the above, it would be desirable to provide temperature sensor circuits having accurate temperature determinations while being integrated with new device technology having a smaller footprint effect on an integrated circuit device and maintains integrity.

BRIEF DESCRIPTION OF THE DRAWINGS

FIGS. 4A and 4B are circuit schematic diagrams of complementary IGFETs having a plurality of horizontally disposed channels that can be vertically aligned above a substrate with each channel being surrounded by a gate structure according to an embodiment.

FIG. 5 is a block schematic diagram of a temperature sensor circuit according to an embodiment.

FIG. 6 is a circuit schematic diagram of a reference voltage generator according to an embodiment.

FIGS. 7A and 7B are circuit schematic diagrams of a step down circuit according to an embodiment.

DETAILED DESCRIPTION OF THE EMBODIMENTS

According to the embodiments set forth below, an integrated circuit device may include a plurality of transistors having a plurality of vertically stacked horizontal channels with improved gate control which operate at a low power supply potential (for example 0.5 volts). The integrated circuit device may further include a temperature sensor circuit. The temperature sensor circuit may include transistors having a plurality of vertically stacked horizontal channels. The temperature sensor circuit may operate at a substantially higher power supply potential and may include at least one active device (active circuit element) having a different process technology than the transistors having a plurality of vertically stacked horizontal channels.

Figure 1:
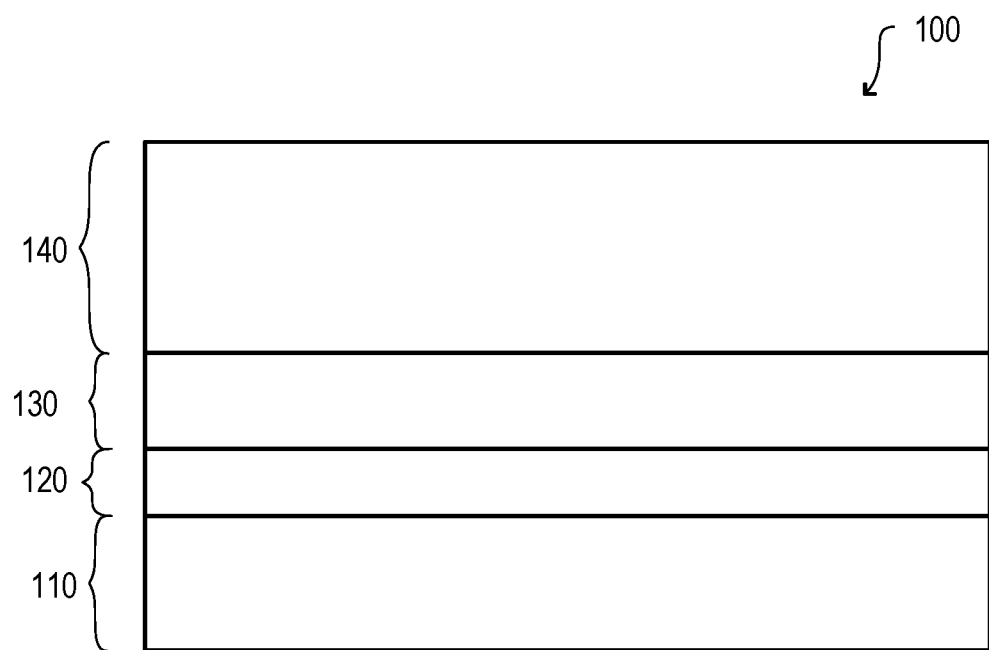
FIG. 1 is a schematic diagram of an integrated circuit device according to an embodiment.

Referring now to FIG. 1, an integrated circuit device according to an embodiment is set forth in a cross-sectional schematic diagram and given the general reference character 100.

Integrated circuit device 100 may include regions (110, 120, 130, and 140). Region 110 may be a semiconductor region that can include a process for making a bipolar junction transistor (BJT). Region 120 may be an insulator layer. Region 130 may be a silicon material such as silicon, silicon carbide, or epitaxial silicon, as just a few examples. Region 140 may include a plurality of transistors, each transistor having a plurality of vertically stacked horizontal channels.

Integrated circuit device 100 may be a processor device, a memory device, or the like.

Region 110 may be formed using an older process technology that requires much less cost than region 140. Region 110 may contain at least a portion of a temperature sensor circuit as will be discussed later in the specification. Region 140 may contain the circuitry for processing functions of a processor device or control circuits, decoding circuits, and memory cells of a memory device as just a few examples.

Integrated circuit device 100 may be contiguous structures, such that, regions may be deposited or bonded in a semiconductor fabrication facility and preferably all formed on a contiguous wafer in a multiple of units and then separated before packaged or set in a multi-chip package. For example, regions (110, 120, 130, and 140) may be contiguous regions with essentially no separation other than a region border formed by a change of materials. Bonding of regions may be performed using wafer to wafer bonding, for example regions (110 and/or 120) may be formed on a first semiconductor wafer and regions (120 and/or 130, and 140) may be formed on a second semiconductor wafer, then the first and second wafer may be bonded using a wafer to wafer bonding technique followed by dicing and packaging to form the integrated circuit device. Alternatively, regions (110 and/or 120) may be formed on a first semiconductor wafer and regions (120 and/or 130, and 140) may be formed on a second semiconductor wafer, then either the first or second wafer may be diced and a die pick and place may be used to place dies on the first or second intact wafer, followed by dicing and packaging to form the integrated circuit device.

Figure 2:
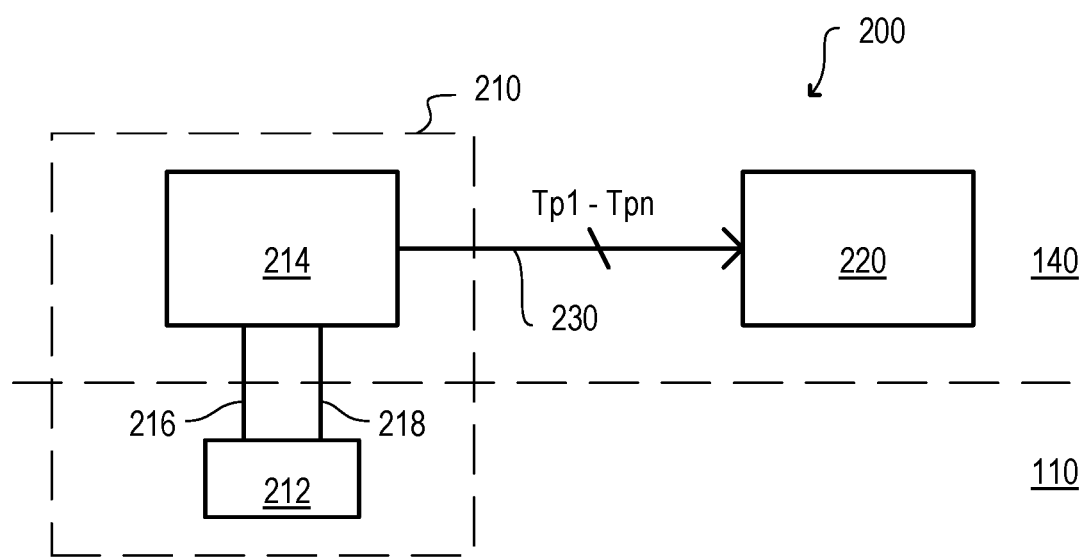
FIG. 2 is a block schematic diagram of an integrated circuit device according to an embodiment is set forth.

Referring now to FIG. 2, a block schematic diagram of an integrated circuit device according to an embodiment is set forth and given the general reference character 200.

Integrated circuit device 200 can include a temperature sensor circuit 210 and core circuitry 220. For example, if integrated circuit device 200 is a processor device, core circuitry 220 may include processing functions and if integrated circuit device 200 is a memory device, core circuit 220 may include read/write circuitry, control circuitry, decoding circuitry, and memory cells.

Core circuitry 220 may be formed in region 140. However, temperature sensor circuit 210 may include a first circuit portion 212 formed in region 110 and a second circuit portion 214 formed in region 140. In this way, different technologies may be used to form the temperature senor circuit 210 without mixing technologies in region 140, which may be formed with state of the art cutting edge process technology and may be incompatible with the first circuit portion 212 of the temperature sensor circuit 210.

First circuit portion 212 may be electrically connected to second circuit portion 214 by way of interconnect wirings (216 and 218).

Temperature sensor circuit 210 may provide temperature signals (Tp1 to Tpn) to core circuitry 220 by way of temperature signal bus 230. Core circuitry 220 may include parameter control circuitry which may change operational parameters in response to the state of temperature signals (Tp1 to Tpn). Such parameter control circuitry can include refresh control circuitry that changes the refresh rate in a dynamic random access memory (DRAM) in response to the temperature signals (Tp1 to Tpn). Other parameter control circuitry can include clock control circuitry that changes a clock signal operating processing circuitry in a processor device in response to the temperature signals (Tp1 to Tpn). Yet another parameter control circuitry can include read assist and write assist control circuitry that enables/disables read assist circuitry and/or write assist circuitry in a static random access memory (SRAM). Such read assist circuitry and/or write assist circuitry can include changing word line potential and or bit line potential during a read and/or write of data in an SRAM memory cell as just a few examples.

A description of the plurality of transistors formed in region 140 will now be discussed with reference to FIGS. 3A to 3C.

Figure 3A:
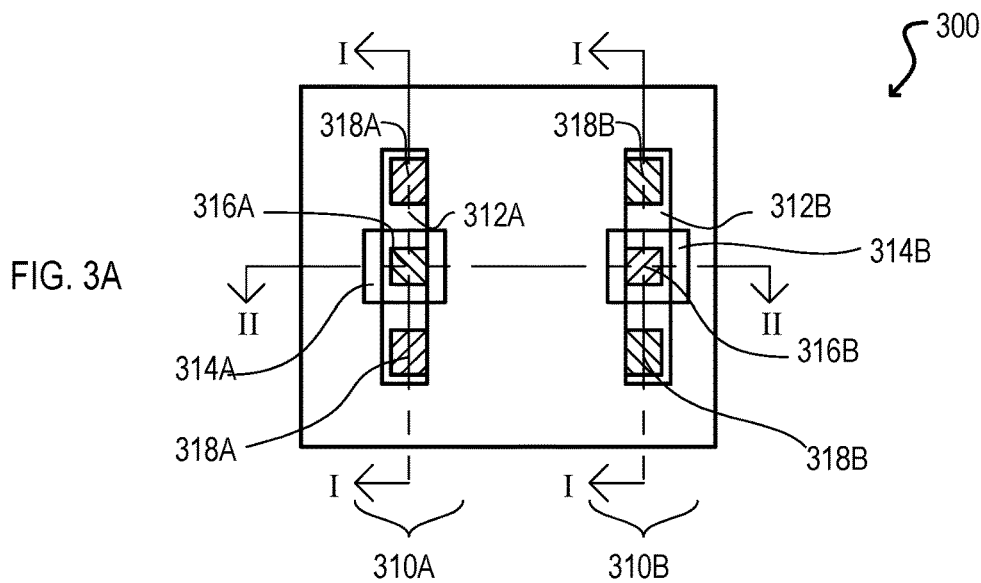
FIG. 3A is a top plan view of an integrated circuit device including transistors according to an embodiment.

Referring now to FIG. 3A, a top plan view of an integrated circuit device including transistors according to an embodiment is set forth and given the general reference character 300.

Integrated circuit device 300 may include an N-type insulated gate field effect transistor (IGFET) 310A and a P-type IGFET 310B.

N-type IGFET 310A and P-type IGFET 310B may each include a control gate that may surround a plurality of horizontally disposed channel regions that can be vertically aligned above a substrate.

N-type IGFET 310A may include drain/source contacts 318A, a gate contact 316A, a gate structure 314A, and vertically aligned and horizontally disposed channel region structures 312A.

P-type IGFET 310B may include drain/source contacts 318B, a gate contact 316B, a gate structure 314B, and vertically aligned and horizontally disposed channel region structures 312B.

Figure 3B:
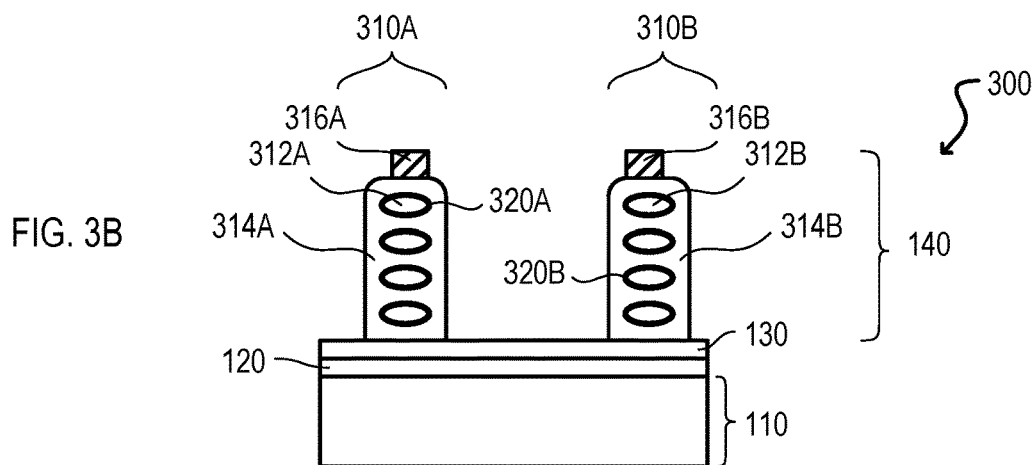
FIG. 3B is a cross sectional view of an integrated circuit device including transistors according to an embodiment.

Referring now to FIG. 3B, a cross sectional view of integrated circuit device 300 according to an embodiment is set forth. The cross-sectional view is along the line II-II of FIG. 3A.

Integrated circuit device 300 may include a N-type IGFET 310A, and a P-type IGFET 310B formed in region 140 above regions (110, 120, and 130).

N-type IGFET 310A may include a gate contact 316A, a gate structure 314A, and vertically aligned and horizontally disposed channel regions 312A, and gate insulating layer 320A. Gate insulating layer 320A may surround each vertically aligned and horizontally disposed channel regions 312A.

P-type IGFET 310B may include a gate contact 316B, a gate structure 314B, and vertically aligned and horizontally disposed channel regions 312B, and gate insulating layer 320B. Gate insulating layer 320B may surround each vertically aligned and horizontally disposed channel regions 312B.

Gate structures (314A and 314B) are each contiguous gate structures that surround channel regions (312A and 312B), respectively.

As will be discussed later, IGFETS including vertically aligned and horizontally disposed channel region structures may be used in core circuitry 220 and second circuit portion 214 of temperature sensor circuit 210 of FIG. 2

Figure 3C:
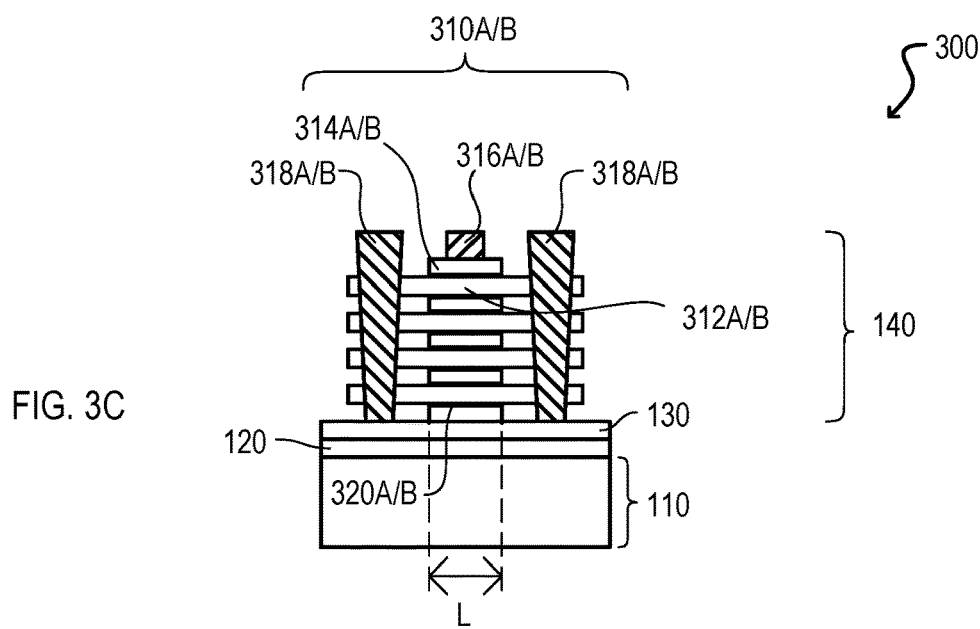
FIG. 3C is a cross sectional view of an integrated circuit device including transistors according to an embodiment.

Referring now to FIG. 3C, a cross sectional view of integrated device 300 is set forth. The cross-sectional view is along the line I-I of FIG. 3A. As shown in FIG. 3A, there are two lines I-I as the N-type IGFET 310A and P-type IGFET 310B may have similar structures except the materials and/or doping of materials may differ and elements are designated with the suffix "A/B" to illustrate such. Semiconductor device 300 may include N-type and P-type IGFETs (310A/B) formed in region 140 above regions (110, 120, and 130). IGFET 310A/B may include a gate contact 316A/B, a gate structure 314A/B, vertically aligned and horizontally disposed channel regions 312A/B, gate insulating layer 320A/B, and drain/source contacts 318A/B. Gate structure 316A/B and gate insulating layer 320A/B may surround each vertically aligned and horizontally disposed channel regions 312A/B.

Drain/source contacts (318A/B) are commonly shared by the plurality of channel regions 312A/B, respectively to form common drain/source terminals for each IGFET (310A and 310B).

IGFETs (310A and 310B) may be formed by forming a layered crystal of two materials over region 130. For example, layers of silicon and silicon germanium may be formed. An etch and deposit step may then be used to form the source/drain regions (318A and 318B) may be formed. The silicon layer may form the channel regions (312A and 312B). After a vertical etch, the silicon germanium layers may be etched by using a chemical that can selectively etch silicon germanium with the source/drain regions (318A and 318B) used as support structures. Next, the gate dielectric layers (320A and 320B) may be formed using atomic layer deposition, for example of hafnium-dioxide. Then gate structure (316A and 316B) may be formed using atomic layer deposition of a metal layer, for example, tungsten. The n-type IGFETs 310A may have source/drain regions 438A doped with n-type carriers, such as phosphorous and/or arsenic, for example. The p-type IGFETs 310B may have source/drain regions 318B doped with p-type carriers, such as boron, for example. IGFETs (310A and 310B) may have a gate length L (i.e. channel length) of less than about 10 nm and may preferably have a gate length L of less than about 6 nm.

Referring now to FIGS. 4A and 4B, circuit schematic diagrams of complementary IGFETs having a plurality of horizontally disposed channels that can be vertically aligned above a substrate with each channel being surrounded by a gate structure according to an embodiment are set forth. FIG. 4A is a N-channel IGFET 400A and FIG. 4B is a P-channel IGFET 400B.

N-channel IGFET 400A includes a control gate terminal 410A, a first source/drain terminal 420A, and a second source/drain terminal 430A. Control gate terminal 410A may be electrically connected to control gate 412A. Control gate 412A may be drawn as a plurality of control gates on each side of a plurality of channel region 414A. In reality, control gate 412A may surround a plurality of horizontally disposed channel regions 414A that can be vertically aligned above a substrate. Each channel region 414A may form a controllable impedance path between first source/drain terminal 420A, and second source/drain terminal 430A. Control gate 412A may provide control to the controllable impedance path based on a threshold voltage for distinguishing between a high impedance path and a low impedance path.

P-channel IGFET 400B includes a control gate terminal 410B, a first source/drain terminal 420B, and a second source/drain terminal 430B. Control gate terminal 410B may be electrically connected to control gate 412B. Control gate 412B may be drawn as a plurality of control gates on each side of a plurality of channel region 414B. In reality, control gate 412B may surround a plurality of horizontally disposed channel regions 414B that can be vertically aligned above a substrate. Each channel region 414B may form a controllable impedance path between first source/drain terminal 420B, and second source/drain terminal 430B. Control gate 412B may provide control to the controllable impedance path based on a threshold voltage for distinguishing between a high impedance path and a low impedance path.

It is understood throughout the FIGS., any IGFET drawn similarly to IGFETs (400A and/or 400B) illustrate IGFETs that have a plurality of horizontally disposed and vertically aligned channel regions.

Referring now to FIG. 5, a block schematic diagram of a temperature sensor circuit according to an embodiment is set forth and given the general reference character 500. Temperature sensor circuit 500 may correspond to temperature sensor circuit 210 in integrated circuit device 200 of FIG. 2.

Temperature sensor circuit 500 may include a reference generator circuit 510, a pump circuit 520, step down circuits (530 and 540) and a temperature output circuit 550.

Pump circuit 520 may receive a power supply potential VDD and may provide a boosted power supply potential Vpmp as an output. Reference generator circuit 510 may receive boosted power supply potential Vpmp and may provide a reference voltage $V_{BGREF}$ to step down circuit 530 a temperature dependent reference voltage $V_{TEMP}$ to step down circuit 540. Reference voltage $V_{BGREF}$ may be essentially independent of temperature and temperature dependent reference voltage $V_{TEMP}$ may be a temperature dependent potential.

Step down circuit 530 may provide a stepped down reference voltage $VS_{BGREF}$ which may also be essentially independent of temperature and essentially proportional to reference voltage $V_{BGREF}$. Step down circuit 540 may provide a stepped down temperature dependent reference voltage $VS_{TEMP}$ that is essentially proportional to temperature dependent reference voltage $V_{TEMP}$.

Temperature output circuit 550 may receive stepped down reference voltage $VS_{BGREF}$ and stepped down temperature dependent reference voltage $VS_{TEMP}$ and may provide temperature signals Tp1-Tpn, where n is the number of temperature signals provided. Each temperature signal Tp1-Tpn may indicate a temperature range or temperature window in which integrated circuit device 100 is operating. Temperature signals Tp1-Tpn may be generated by comparing the stepped down reference voltage $VS_{BGREF}$, which is essentially temperature independent, with stepped down temperature dependent reference voltage $VS_{TEMP}$ and activating the temperature signal Tp1-Tpn to indicate the temperature window in which integrated circuit device 100 (FIG. 1) is operating based on the comparison. As noted with reference to FIG. 2, temperature sensor circuit 500 may include a first circuit portion 212 formed in region 110 and a second circuit portion 214 formed in region 140 of integrated circuit device 100.

Reference voltage generator 510 will now be described with reference to FIG. 6.

Referring now to FIG. 6, a reference voltage generator according to an embodiment is set forth in a circuit schematic diagram.

The reference voltage generator 510 may include a bandgap reference input section 610 and a bandgap reference output section 620. Bandgap reference input section 610 may provide a temperature dependent reference voltage $V_{TEMP}$. The potential of temperature dependent reference voltage $V_{TEMP}$ may change inversely to the change in the temperature of the integrated circuit 100. Bandgap reference output section 620 can receive temperature dependent reference voltage $V_{TEMP}$ and may provide an essentially temperature independent reference voltage $V_{BGREF}$. An example of a bandgap reference output section providing a temperature independent reference voltage can be seen in U.S. Pat. No. 6,150,872 incorporated herein by reference or U.S. Pat. No. 6,549,065 incorporated herein by reference, as just two examples.

Bandgap reference input section 610 may include bipolar transistors (Q602 and Q604), resistor R600, transistors (P602 and P604), and amplifier AMP600. Bipolar transistor Q602 may have an emitter commonly connected to a negative input of amplifier AMP600 and a drain of transistor P602. Bipolar transistor Q604 may have an emitter connected to a first terminal of resistor R600. Bipolar transistors (Q602 and Q604) may have bases and collectors commonly connected to a ground terminal. Alternatively, in some cases the bases and collectors may be connected to a negatively charged substrate voltage, as just one more example. Resistor R600 may have a second terminal commonly connected to a positive input of amplifier AMP600 and a drain of transistor P604. Amplifier AMP600 may provide temperature dependent reference voltage $V_{TEMP}$ as an output, which is also fed back to the gates of transistors (P602 and P604). Transistors (P602 and P604) may have sources connected to boosted power supply voltage Vpmp.

In bandgap reference input section 610, the feedback (via transistors P602 and P604) of amplifier AMP600 biases the second terminal of resistor R600 and the emitter of bipolar transistor Q602 to be essentially the same voltage. However, in a bandgap reference input section 610, it is known that the voltage across resistor R600 has a positive temperature characteristic in that $VR1=(kT/q)\times \ln(n)$, where k is Boltzman's constant, q is electronic charge, and n is the junction area ratio of diode configured bipolar transistors Q604 to Q602. Thus, as temperature increases, current through resistor R600 must increase to provide the positive temperature characteristic. This is accomplished by increasing the current in transistor P604 by lowering the voltage $V_{TEMP}$.

Bipolar transistors (Q602 and Q604) may be substrate lateral or vertical pnp bipolar transistors and may be at least a portion of first circuit portion 212 formed in region 110 of integrated circuit device 100 (FIG. 1) and transistor Q604 may be sized at nQ602. Transistors (P602 and P604) may be p-channel insulated gate field effect transistors (IGFET) having a plurality of vertically stacked horizontal channels such as IGFET 310B illustrated in FIGS. 3A to 3C and IGFET 400B illustrated in FIG. 4B. Transistors (P602 and P604) may be at least a portion of second circuit portion 214 formed in region 140 of integrated circuit device 100 (FIG. 1).

Bipolar transistors (Q602 and Q604) and transistors (P602 and P604) may be active circuit components (active circuit elements), while resistor R600 and interconnect wirings (between circuit components) may be considered passive. Bipolar transistors (Q602 and Q604), i.e. base regions, collector regions, and emitter regions, may be formed completely within region 110 and transistors (P602 and P604), i.e. source regions, gate regions, and drain regions, may be formed completely within region 140. Passive components, such as resistor R600 and interconnect wirings may be formed in any of regions (110, 120, 130, and/or 140).

Bipolar transistors (Q602 and Q604) may essentially form a p-n junction diode circuit element, each having the emitter region forming an anode terminal and the base terminal forming a cathode terminal.

Referring now to FIG. 7A, a circuit schematic diagram of a step down circuit according to an embodiment is set forth and given the general reference character 700A. Step down circuit 700A may be used as step down circuit 530 in temperature sensor circuit 500 of FIG. 5.

Step down circuit 700A may include resistors (R710 and R720). Resistor 710 may have a first terminal connected to a ground potential and a second terminal commonly connected to a first terminal of resistor R720 to provide stepped down reference voltage $VS_{BGREF}$. Resistor R720 may have a second terminal connected to receive reference voltage $V_{BGREF}$. Resistors (R710 and R720) may be made of the exact same type of resistive material to ensure that their temperature variations are identical and proportional. In this way, stepped down reference voltage $VS_{BGREF}$ can also be essentially independent of temperature. The stepped down reference voltage $VS_{BGREF}$ can be a low enough voltage such that IGFET, such as IGFETs (400A and 400B) (FIGS. 4A and 4B) having a plurality of horizontally disposed and vertically aligned channel regions do not receive undue voltage stress that can cause, for example, breakdown of a gate insulating layer 320A/B (FIGS. 3B and 3C).

Referring now to FIG. 7B, a circuit schematic diagram of a step down circuit according to an embodiment is set forth and given the general reference character 700B. Step down circuit 700B may be used as step down circuit 530 in temperature sensor circuit 500 of FIG. 5.

Step down circuit 700B may include IGFETs (N702, N704, and N706). Each IGFET (N702, N704, and N706) can include a plurality of horizontally disposed and essentially vertically aligned channel regions and may be n-type IGFETs. IGFET N702 may have a source terminal connected to a ground potential and a source terminal and a drain terminal terminal commonly connected to a source terminal of IGFET N704 to provide stepped down reference voltage $VS_{BGREF}$. IGFET N702 may have a drain terminal and a gate terminal commonly connected to a source terminal of IGFET N706. IGFET N706 may have a drain terminal and a gate terminal commonly connected to receive reference voltage $V_{BGREF}$. IGFETs (N702, N704, and N706) may be made identical in size and may be "layed out" to be identical in geometric shape to ensure that their temperature variations are identical and proportional. In this way, stepped down reference voltage $VS_{BGREF}$ can also be essentially independent of temperature. The stepped down reference voltage $VS_{BGREF}$ can be a low enough voltage such that IGFET, such as IGFETs (400A and 400B) (FIGS. 4A and 4B) having a plurality of horizontally disposed and vertically aligned channel regions do not receive undue voltage stress that can cause, for example, breakdown of a gate insulating layer 320A/B (FIGS. 3B and 3C). It is noted that there may be more or less than the number of IGFETs (N702, N704, and N706) illustrated in FIG. 7B and the tap point for stepped down reference voltage $VS_{BGREF}$ may be at a different point depending on the voltage magnitude desired.

Figure 8A:
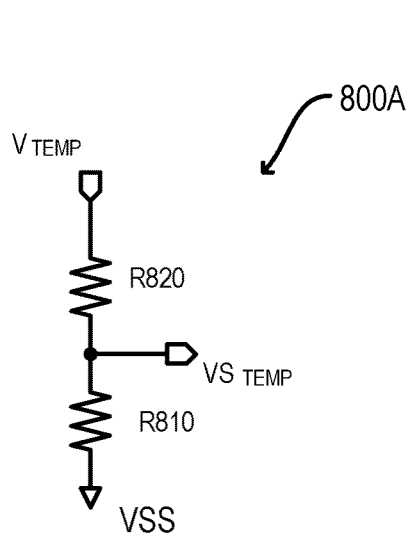
FIGS. 8A and 8B are circuit schematic diagrams of a step down circuit according to an embodiment.

Referring now to FIG. 8A, a circuit schematic diagram of a step down circuit according to an embodiment is set forth and given the general reference character 800A. Step down circuit 800A may be used as step down circuit 540 in temperature sensor circuit 500 of FIG. 5.

Step down circuit 800A may include resistors (R810 and R820). Resistor 810 may have a first terminal connected to a ground potential and a second terminal commonly connected to a first terminal of resistor R820 to provide stepped down temperature dependent reference voltage $VS_{TEMP}$. Resistor R820 may have a second terminal connected to receive temperature dependent reference voltage $V_{TEMP}$. Resistors (R810 and R820) may be made of the exact same type of resistive material to ensure that their temperature variations are identical and proportional. In this way, stepped down temperature dependent reference voltage $VS_{TEMP}$ can follow the same temperature dependence and be directly proportional to temperature dependent reference voltage $V_{TEMP}$. The stepped down temperature dependent reference voltage $VS_{TEMP}$ can be a low enough voltage such that IGFET, such as IGFETs (400A and 400B) (FIGS. 4A and 4B) having a plurality of horizontally disposed and vertically aligned channel regions do not receive undue voltage stress that can cause, for example, breakdown of a gate insulating layer 320A/B (FIGS. 3B and 3C).

Figure 8B:
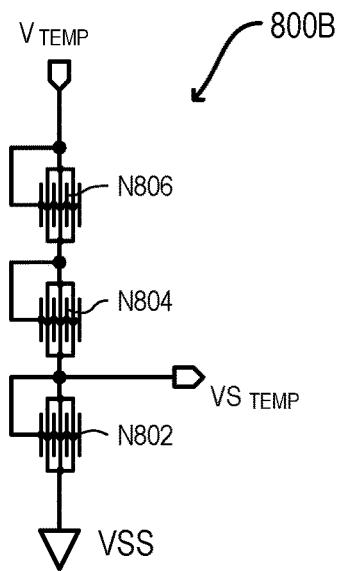

Referring now to FIG. 8B, a circuit schematic diagram of a step down circuit according to an embodiment is set forth and given the general reference character 800B. Step down circuit 800B may be used as step down circuit 540 in temperature sensor circuit 500 of FIG. 5.

Step down circuit 800B may include IGFETs (N802, N804, and N806). Each IGFET (N802, N804, and N806) can include a plurality of horizontally disposed and essentially vertically aligned channel regions and may be n-type IGFETs. IGFET N802 may have a source terminal connected to a ground potential and a source terminal and a drain terminal commonly connected to a source terminal of IGFET N804 to provide stepped down temperature dependent reference voltage $VS_{TEMP}$. IGFET N802 may have a drain terminal and a gate terminal commonly connected to a source terminal of IGFET N806. IGFET N806 may have a drain terminal and a gate terminal commonly connected to receive temperature dependent reference voltage $VB_{TEMP}$. IGFETs (N802, N804, and N806) may be made identical in size and may be "layed out" to be identical in geometric shape to ensure that their temperature variations are identical and proportional. In this way, stepped down temperature dependent reference voltage $VS_{TEMP}$ can follow the same temperature dependence and be directly proportional to temperature dependent reference voltage $V_{TEMP}$. The stepped down temperature dependent reference voltage $VS_{TEMP}$ can be a low enough voltage such that IGFET, such as IGFETs (400A and 400B) (FIGS. 4A and 4B) having a plurality of horizontally disposed and vertically aligned channel regions do not receive undue voltage stress that can cause, for example, breakdown of a gate insulating layer 320A/B (FIGS. 3B and 3C). It is noted that there may be more or less than the number of IGFETs (N802, N804, and N806) illustrated in FIG. 8B and the tap point for stepped down temperature dependent reference voltage $VS_{TEMP}$ may be at a different point depending on the voltage magnitude desired.

Figure 9:
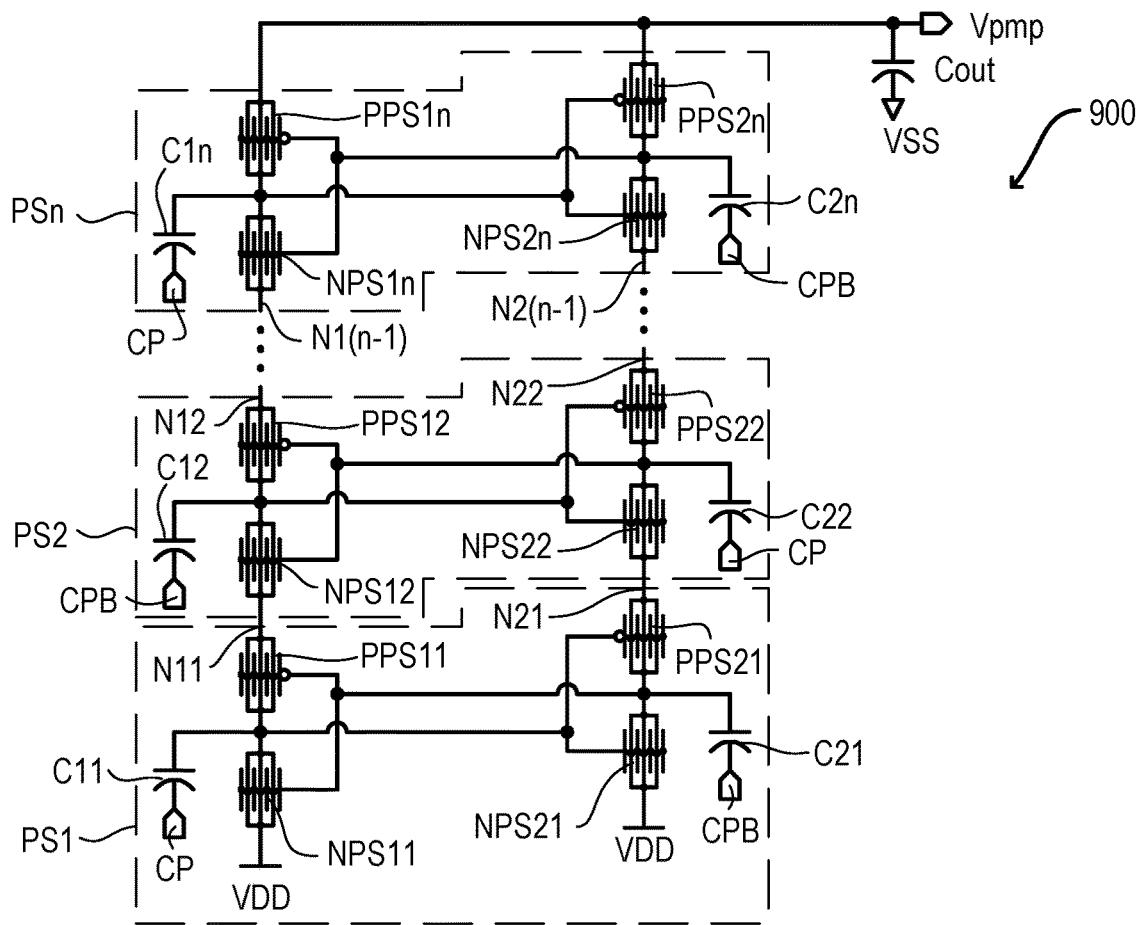
FIG. 9 is a circuit schematic diagram of a pump circuit according to an embodiment.

Referring now to FIG. 9, a circuit schematic diagram of a pump circuit according to an embodiment is set forth and given the general reference character 900. Pump circuit 900 may be used as pump circuit 520 in temperature sensor circuit 500 of FIG. 5.

Pump circuit 900 may receive power supply potential VDD, a pump clock signal CP and a complementary pump clock signal CPB and may generate a boosted power supply potential Vpmp.

Pump circuit 900 may include pump circuit stages (PS1, PS2 to PSn), where n is the number of pump circuit stages. Each pump circuit stage (PS1, PS2 to PSn) may increase the boosted power supply potential by no more than about the power supply potential VDD over the potential of the power supply potential VDD. For example, one pump circuit stage PS1 would provide a boosted power supply potential Vpmp of about 2 times power supply potential VDD. Thus, n pump circuit stages (PS1, PS2 to PSn) may provide a boosted power supply potential no greater than (n+1) times the potential of the power supply potential VDD.

Pump circuit stage PS1 may receive pump clock signal CP, complementary pump clock signal CPB, and power supply potential VDD as inputs and may provide boosted potential outputs at terminals (N11 and N21). Pump circuit stage PS1 may include n-type IGFETs (NPS11 and NPS21), p-type IGFETs (PPS11 and PPS21), and capacitors (C11 and C21). Capacitor C11 may receive pump clock signal CP at a first terminal and may have a second terminal commonly connected to drain terminal of N-type IGFET NPS11, drain terminal of p-type IGFET PPS11, gate terminal of n-type IGFET NPS21, and gate terminal of p-type IGFET PPS21. Capacitor C21 may receive complementary pump clock signal CPB at a first terminal and may have a second terminal commonly connected to drain terminal of N-type IGFET NPS21, drain terminal of p-type IGFET PPS21, gate terminal of n-type IGFET NPS11, and gate terminal of p-type IGFET PPS11. N-type IGFETs (NPS11 and NPS21) may have source terminals connected to receive power supply potential VDD. P-type IGFET PPS11 may have a source terminal connected to provide a boosted potential output at terminal N11. P-type IGFET PPS21 may have a source terminal connected to provide a boosted potential output at terminal N21.

Pump circuit stage PS2 may receive pump clock signal CP and complementary pump clock signal CPB as inputs and may provide boosted potential outputs at terminals (N12 and N22). Pump circuit stage PS2 may include n-type IGFETs (NPS12 and NPS22), p-type IGFETs (PPS12 and PPS22), and capacitors (C12 and C22). Capacitor C12 may receive complementary pump clock signal CPB at a first terminal and may have a second terminal commonly connected to drain terminal of N-type IGFET NPS12, drain terminal of p-type IGFET PPS12, gate terminal of n-type IGFET NPS22, and gate terminal of p-type IGFET PPS22. Capacitor C22 may receive pump clock signal CP at a first terminal and may have a second terminal commonly connected to drain terminal of N-type IGFET NPS22, drain terminal of p-type IGFET PPS22, gate terminal of n-type IGFET NPS12, and gate terminal of p-type IGFET PPS12. N-type IGFET NPS12 may have source terminal connected to a boosted potential from node N11. N-type IGFET NPS22 may have source terminal connected to a boosted potential from node N21. P-type IGFET PPS12 may have a source terminal connected to provide a boosted potential output at terminal N12. P-type IGFET PPS22 may have a source terminal connected to provide a boosted potential output at terminal N22.

The dotted line indicates that other pump stage circuits (i.e. PS3, PS4, PS5, etc) may be connected until a nth pump stage circuit PSn may be connected as the circuit providing the boosted power supply potential Vpmp at a first terminal of a load capacitor Cout. A second terminal of load capacitor Cout may be connected to a reference potential VSS.

Nth pump stage circuit PSn may receive pump clock signal CP, complementary pump clock signal CPB, and power supply potential VDD as inputs and may provide boosted power supply potential Vpmp at the first terminal of load capacitor Cout. Pump circuit stage PSn may include n-type IGFETs (NPS1*n* and NPS2*n*), p-type IGFETs (PPS1*n* and PPS2*n*), and capacitors (C11 and C21). Capacitor C1*n* may receive pump clock signal CP at a first terminal (when n is odd, complementary pump clock signal CPB when n is even) and may have a second terminal commonly connected to drain terminal of N-type IGFET NPS1*n*, drain terminal of p-type IGFET PPS1*n*, gate terminal of n-type IGFET NPS2*n*, and gate terminal of p-type IGFET PPS2*n*. Capacitor C2*n* may receive complementary pump clock signal CPB (when n is odd, pump clock signal CP when n is even) at a first terminal and may have a second terminal commonly connected to drain terminal of N-type IGFET NPS2*n*, drain terminal of p-type IGFET PPS2*n*, gate terminal of n-type IGFET NPS1*n*, and gate terminal of p-type IGFET PPS1*n*. N-type IGFETs NPS1*n* may have a source terminal connected to receive a boosted potential from node N1(*n*−1). N-type IGFETs NPS2*n* may have a source terminal connected to receive a boosted potential from node N2(*n*−1). P-type IGFET PPS1*n* may have a source terminal connected to provide boosted power supply potential Vpmp. P-type IGFET PPS2*n* may have a source terminal connected to provide a boosted power supply potential Vpmp.

The operation of pump circuit 900 will now be explained. When pump clock signal CP transitions from a logic low to a logic high potential (from VSS to VDD), n-type IGFET NPS21 turns on and essentially a power supply potential VDD can be transferred to the terminal of capacitor C21. At this time, complementary pump clock signal CPB transitions from a logic high to a logic low potential (from VDD to VSS). This can turn off n-type IGFET NPS11 and turn on p-type IGFET PPS11. In this way, a boosted potential from capacitor C11 can be transferred to boosted potential node N11. Next, pump clock signal CP transitions from a logic high to a logic low potential and complementary pump clock signal CPB transitions from a logic low to a logic high potential, n-type IGFET NPS11 may turn on and p-type IGFET PPS21 may turn on, while p-type IGFET PPS11 may turn off and n-type IGFET NPS21 may turn off. With p-type IGFET PPS21 turned on, the boosted potential of capacitor C21 may be transferred to boosted potential node N21. In this way, pump circuit stage PS1 can generate a boosted potential at boosted potential nodes (N11 and N21). The subsequent pump circuit stages (PS2 to PSn) can keep boosting the potentials received in the same manner to provide a final boosted power supply potential Vpmp at the load capacitor Cout.

All n-type IGFETs and p-type IGFETs in pump circuit 900 are IGFETs that have a plurality of essentially vertically aligned and horizontally disposed channel regions. Pump circuit 900 can produce a boosted power supply potential Vpmp that can be a multiple of power supply potential VDD without overstressing the gate insulating layers (320A and 320B (FIG. 3B and FIG. 3C) of the P-type IGFETs (PPS11 to PPS2n) or N-type IGFETs (NPS11 to NPS2n) in pump circuit 900 by producing a gate to source/drain potential on each P-type IGFETs (PPS11 to PPS2n) or N-type IGFETs (NPS11 to NPS2n) that is no greater in magnitude than the power supply potential VDD.

Pump clock signal CP and complementary pump clock signal CPB can be complementary clock signals that have a predetermined frequency and period toggling between logic high and logic low. The predetermined frequency and period can be such that capacitors (C11 to CN2n) can be adequately charged and discharged to provide the desired boosted power supply potential Vpmp.

The temperature output circuit 550 of FIG. 5 will now be described with reference to FIG. 10.

Figure 10:
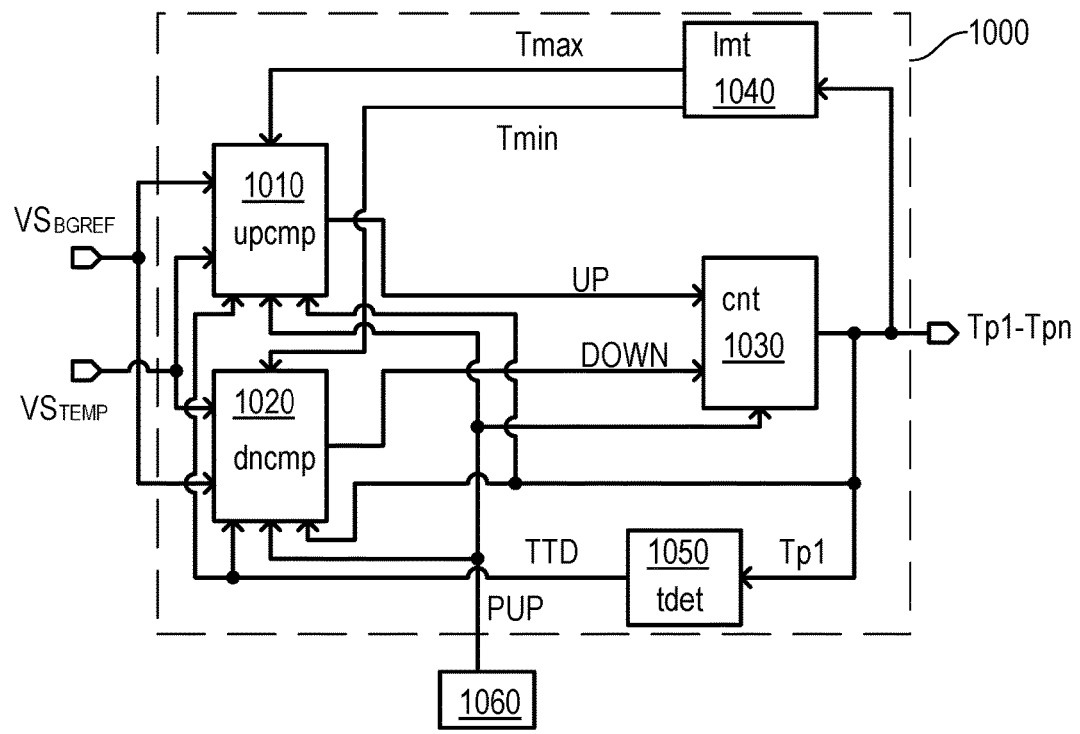
FIG. 10 is a block schematic diagram of a circuit including a temperature output circuit and a power up circuit according to an embodiment.

Referring now to FIG. 10, a circuit including a temperature output circuit 1000 and a power up circuit 1060 is set forth in a block schematic diagram. Temperature output circuit 1000 may correspond to temperature output circuit 550 of FIG. 5. Temperature output circuit 1000 can receive essentially temperature independent stepped down reference voltage $VS_{BGREF}$ and stepped down temperature dependent reference voltage $VS_{TEMP}$ as inputs and may provide temperature signals Tp1-Tpn as outputs. Temperature signals Tp1-Tpn may have a temperature range value based on a comparison of the potentials of temperature independent stepped down reference voltage $VS_{BGREF}$ and stepped down temperature dependent reference voltage $VS_{TEMP}$. Temperature output circuit 1000 may receive a power up signal PUP generated by power up circuit 1060. Temperature output circuit 1000 may set temperature signals Tp1-Tpn to a predetermined temperature range value in response to power up signal PUP. In this way, after a power up of integrated circuit device 100 (FIG. 1), the temperature signals Tp1-Tpn may be set in a known state.

Temperature output circuit 1000 may include an upper window limit comparator circuit 1010, a lower window limit comparator circuit 1020, a count circuit 1030, a limit detection circuit 1040, and a temperature window change detection circuit 1050.

Upper window limit comparator circuit 1010 can receive temperature independent stepped down reference voltage $VS_{BGREF}$, stepped down temperature dependent reference voltage $VS_{TEMP}$, power up signal PUP, temperature transition detection signal TTD, temperature signals Tp1-Tpn, and a maximum temperature window detection signal Tmax, as inputs. Upper window limit comparator circuit 1010 may provide a up count signal UP as an output. Lower window limit comparator circuit 1020 can receive temperature independent stepped down reference voltage $VS_{BGREF}$, stepped down temperature dependent reference voltage $VS_{TEMP}$, power up signal PUP, a temperature transition detection signal TTD, temperature signals Tp1-Tpn, and a minimum temperature window detection signal Tmin as inputs. Lower window limit comparator circuit 1020 may provide a down count signal DOWN as an output.

Count circuit 1030 can receive up count signal UP (upper window limit detection signal), down count signal DOWN (lower window limit detection signal), and power up signal PUP as inputs and may provide temperature signals Tp1-Tpn as outputs.

Limit detection circuit 1040 receives temperature signals Tp1-Tpn as inputs and provides maximum temperature window detection signal Tmax and minimum temperature window detection signal Tmin as outputs.

Temperature window change detection circuit 1050 can receive the least significant bit Tp1 of temperature signals Tp1-Tpn as inputs and may provide temperature transition detection signal TTD as an output.

The operation of temperature output circuit 1000 will now be explained. As mentioned with reference to FIG. 6 above, temperature dependent reference voltage $V_{TEMP}$ decreases as temperature increases and increases as temperature decreases. Therefore, stepped down temperature dependent reference voltage $VS_{TEMP}$ decreases as temperature increases and increases as temperature decreases in the same manner and at essentially the same rate.

Thus, as temperature increases, to a point in which a temperature range as determined by the value of the temperature signals Tp1-Tpn, reaches the temperature window upper limit value, upper window limit comparator circuit 1010 detects this in response to the stepped down temperature dependent reference voltage $VS_{TEMP}$ having a predetermined potential and a count up signal UP having an increment logic level (logic high). Count circuit 1030 receives this and increments the temperature signals Tp1-Tpn to provide a value that is the next increased temperature window value. The temperature signals Tp1-Tpn are fed back to the upper window limit comparator circuit 1010 to provide a new temperature window upper limit and also fed back to the lower window limit comparator circuit 1020 to provide a new temperature window lower limit. As temperature decreases to a point in which a temperature range as determined by the value of the temperature signals Tp1-Tpn, reaches the temperature window lower limit value, lower window limit comparator circuit 1020 detects this in response to the stepped down temperature dependent reference voltage $VS_{TEMP}$ having a predetermined potential and a count down signal DOWN having an increment logic level (logic high). Count circuit 1030 receives this and decrements the temperature signals Tp1-Tpn to provide a value that is the next decreased temperature window value. The temperature signals Tp1-Tpn are fed back to the upper window limit comparator circuit 1010 to provide a new temperature window upper limit and also fed back to the lower window limit comparator circuit 1020 to provide a new temperature window lower limit in accordance with the decreased temperature window value.

When temperature signals Tp1-Tpn are changed (either incremented or decremented), the least significant bit Tp1 transitions logic values and temperature window change detection circuit 1050 can create a temperature window transition detect signal TTD having a pulse. When the temperature window transition detect signal TTD has a pulse, the upper window limit comparator circuit 1010 and the lower window limit comparator circuit 1020 may be prevented from generating a count up signal UP or count down signal DOWN. This may prevent unwanted transitions.

When temperature signals Tp1-Tpn reach a maximum temperature window value (for example all "1s") the limit detection circuit 1040 can generate a maximum temperature window detection signal Tmax having a predetermined logic level (for example, logic high), which can disable the upper window limit comparator circuit 1010 to prevent a "roll-over" of count circuit 1030, for example, from all "1s" to all "0s", which would give an erroneous temperature window of operation in accordance with the value of temperature signals Tp1-Tpn. Likewise, when temperature signals Tp1-Tpn reach a minimum temperature window value (for example all "0s") the limit detection circuit 1040 can generate a minimum temperature window detection signal Tmin having a predetermined logic level (for example, logic high), which can disable the lower window limit comparator circuit 1020 to prevent a "roll-over" of count circuit 1030, for example, from all "0s" to all "1s", which would also give an erroneous temperature window of operation in accordance with the value of temperature signals Tp1-Tpn.

The count up signal UP may be a temperature upper window limit detection signal, the count circuit 1030 may be conceptualized as a control circuit that changes the state of at least one temperature signal Tp1-Tpn in response to the temperature upper window limit detection signal. The count down signal DOWN may be a temperature lower window limit detection signal, the count circuit 1030 may be conceptualized as a control circuit that changes the state of at least one temperature signal Tp1-Tpn in response to the temperature lower window limit detection signal.

Figure 11:
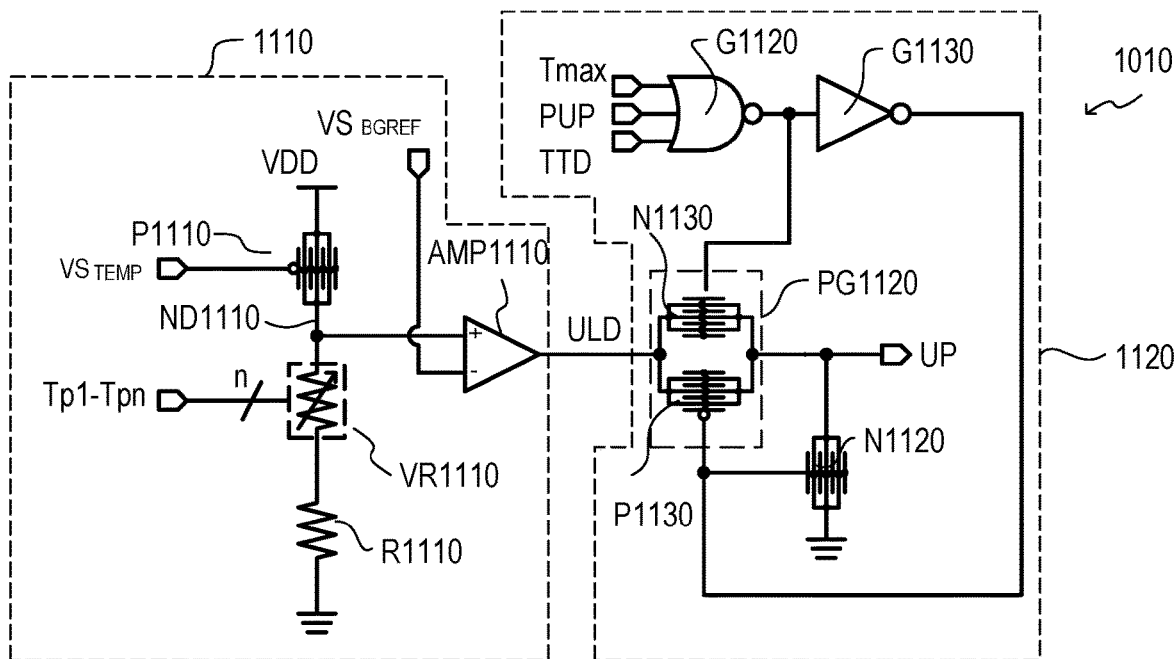
FIG. 11 is a circuit schematic diagram of an upper window limit comparator circuit according to an embodiment.

Referring now to FIG. 11, upper window limit comparator circuit 1010 according to an embodiment is set forth in a circuit schematic diagram. Upper window limit comparator circuit may receive can receive temperature independent stepped down reference voltage $VS_{BGREF}$, stepped down temperature dependent reference voltage $VS_{TEMP}$, power up signal PUP, temperature window transition detection signal TTD, temperature signals Tp1-Tpn, and a maximum temperature window detection signal Tmax, as inputs. Upper window limit comparator circuit 1010 may provide up count signal UP as an output.

Upper window limit comparator circuit 1010 can include an upper limit detection portion and an up count signal output portion 1120. Upper limit detection portion 1110 can receive temperature independent stepped down reference voltage $VS_{BGREF}$, stepped down temperature dependent reference voltage $VS_{TEMP}$, and temperature signals Tp1-Tpn as inputs and may provide an upper limit detection signal ULD as an output. Up count signal output portion 1120 can receive upper limit detection signal ULD, maximum temperature window detection signal Tmax, temperature window transition detection signal TTD, and power up signal PUP as inputs and may provide up count signal UP as an output.

Upper limit detection portion 1110 can include a p-type IGFET P1110, a variable resistor VR1110, a resistor R1110, and an amplifier AMP1110. Up count signal output portion 1120 can include a NOR logic gate G1120, an inverter logic gate G1130, a pass gate PG1120, and an n-type IGFET N1120.

P-channel IGFET P1110 may have a source terminal connected to a power supply potential VDD, a drain commonly connected to a first terminal of variable resistor VR1110 and a positive input terminal of amplifier AMP1110 at node ND1110, and a gate terminal connected to receive stepped down temperature dependent reference voltage $VS_{TEMP}$. The potential of stepped down temperature dependent reference voltage $VS_{TEMP}$ may change inversely to the change in the temperature of the integrated circuit device 100 (FIG. 1). Variable resistor VR1110 may receive Temperature signals Tp1-Tpn as inputs and may have a second terminal connected to a first terminal of resistor R1110. Resistor R1110 may have a second terminal connected to a ground potential. Amplifier AMP1110 may have a negative input terminal connected to receive temperature independent stepped down reference voltage $VS_{BGREF}$. Temperature independent stepped down reference voltage $VS_{BGREF}$ may not vary with temperature and may have an essentially constant potential. Amplifier circuit AMP1110 may provide upper limit detection signal ULD as an output.

NOR logic gate G1120 may receive maximum temperature window detection signal Tmax, power up signal PUP, and temperature window transition detection signal TTD as inputs and may provide an output. Inverter logic gate G1130 may receive the output of NOR logic gate G1120 at an input terminal and may provide an output. Pass gate PG1120 may receive the output of NOR logic gate G1120 and inverter logic gate G1130 as inputs and may provide a controllable impedance path between the output of amplifier AMP1110 and the up count signal UP. N-channel IGFET N1120 may have a drain terminal connected to up count signal UP, a source connected to a ground potential and a gate terminal connected to receive the output of inverter logic gate G1130.

Pass gate PG1120 may include an n-channel IGFET N1130 and a p-channel IGFET P1130 having source/drain terminals connected in parallel between the output of amplifier AMP1110 and an output terminal to provide up count signal UP. N-channel IGFET N1130 may receive the output of NOR logic gate G1120 at a gate terminal. P-channel IGFET P1130 may receive the output of inverter logic gate G1130 at a gate terminal. In this way, pass gate PG1120 may provide a controllable impedance path between the output of amplifier AMP1110 and up count signal UP in response to the output of NOR logic gate G1120.

Variable resistor VR1110 sets a resistance value in response to the state of temperature signals (Tp1-Tpn). In this way, the temperature window upper limit can be set.

IGFETs (P1110, P1130, N1120, and N1130) may be IGFETs including a plurality of vertically stacked horizontal channels as illustrated in FIGS. 3A, 3B, and 3C and may be formed in region 140 of integrated circuit device 100.

Figure 12:
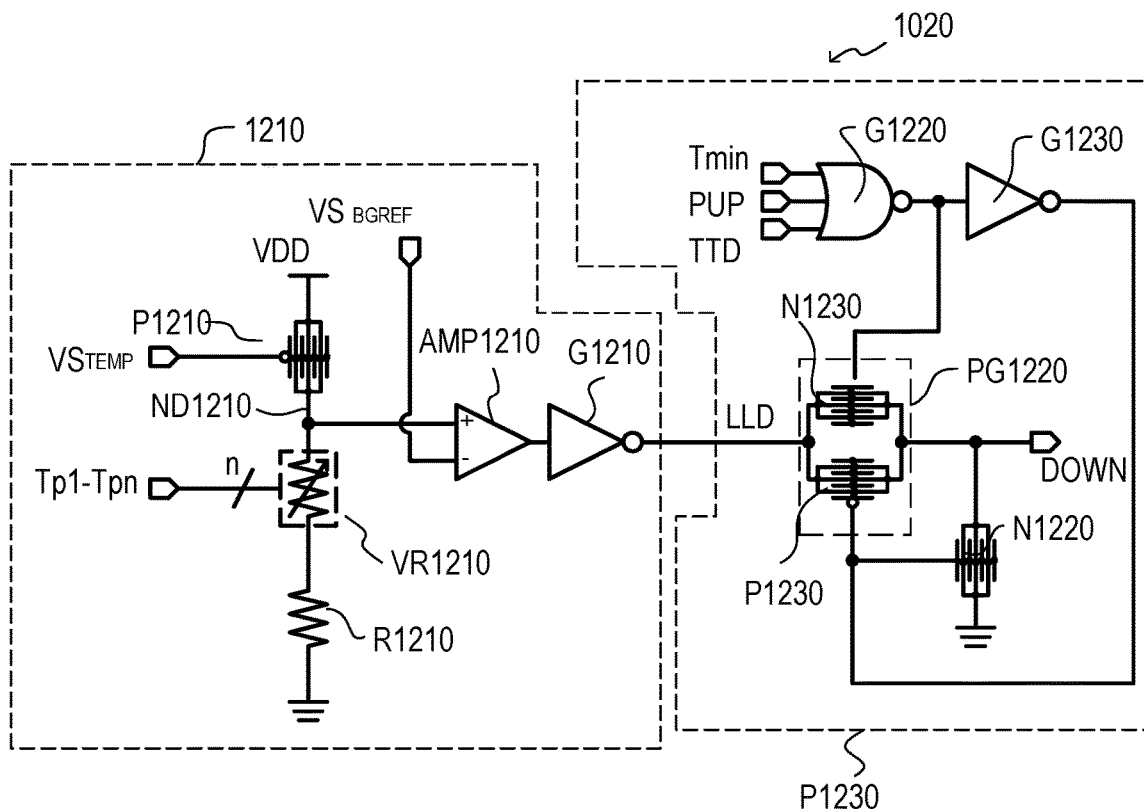
FIG. 12 is a circuit schematic diagram of a lower window limit comparator circuit according to an embodiment.

Referring now to FIG. 12, lower window limit comparator circuit 1020 according to an embodiment is set forth in a circuit schematic diagram. Lower window limit comparator circuit may receive can receive temperature independent stepped down reference voltage $VS_{BGREF}$, stepped down temperature dependent reference voltage $VS_{TEMP}$, power up signal PUP, temperature window transition detection signal TTD, temperature signals Tp1-Tpn, and a minimum temperature window detection signal Tmin, as inputs. Lower window limit comparator circuit 1020 may provide down count signal DOWN as an output.

Lower window limit comparator circuit 1020 can include a lower limit detection portion 1210 and a down count signal output portion 1220. Lower limit detection portion 1210 can receive temperature independent stepped down reference voltage $VS_{BGREF}$, stepped down temperature dependent reference voltage $VS_{TEMP}$, and temperature signals Tp1-Tpn as inputs and may provide a lower limit detection signal LLD as an output. Down count signal output portion 1220 can receive lower limit detection signal LLD, minimum temperature window detection signal Tmin, temperature window transition detection signal TTD, and power up signal PUP as inputs and may provide down count signal DOWN as an output.

Lower limit detection portion 1210 can include a p-type IGFET P1210, a variable resistor VR1210, a resistor R1210, an amplifier AMP1210, and an inverter logic gate G1210. Down count signal output portion 1220 can include a NOR logic gate G1220, an inverter logic gate G1230, a pass gate PG1220, and an n-type IGFET N1220.

P-channel IGFET P1210 may have a source terminal connected to a power supply potential VDD, a drain commonly connected to a first terminal of variable resistor VR1210 and a positive input terminal of amplifier AMP1210 at node ND1210, and a gate terminal connected to receive stepped down temperature dependent reference voltage $VS_{TEMP}$. The potential of stepped down temperature dependent reference voltage $VS_{TEMP}$ may change inversely to the change in the temperature of the integrated circuit device 100 (FIG. 1). Variable resistor VR1210 may receive Temperature signals Tp1-Tpn as inputs and may have a second terminal connected to a first terminal of resistor R1210. Resistor R1210 may have a second terminal connected to a ground potential. Amplifier AMP1210 may have a negative input terminal connected to receive temperature independent stepped down reference voltage $VS_{BGREF}$. Temperature independent stepped down reference voltage $VS_{BGREF}$ may not vary with temperature and may have an essentially constant potential. Amplifier circuit AMP1210 may have an output connected to an input of inverter logic gate G1210. Inverter logic gate G1210 may provide lower limit detection signal LLD as an output.

NOR logic gate G1220 may receive minimum temperature window detection signal Tmin, power up signal PUP, and temperature window transition detection signal TTD as inputs and may provide an output. Inverter logic gate G1230 may receive the output of NOR logic gate G1220 at an input terminal and may provide an output. Pass gate PG1220 may receive the output of NOR logic gate G1220 and inverter logic gate G1230 as inputs and may provide a controllable impedance path between the output of amplifier AMP1210 and the down count signal DOWN. N-channel IGFET N1220 may have a drain terminal connected to down count signal DOWN, a source connected to a ground potential and a gate terminal connected to receive the output of inverter logic gate G1230.

Pass gate PG1220 may include an n-channel IGFET N1230 and a p-channel IGFET P1230 having source/drain terminals connected in parallel between the output of inverter logic gate G1210 (i.e. lower limit detection signal LLD) and an output terminal to provide down count signal DOWN. N-channel IGFET N1230 may receive the output of NOR logic gate G1220 at a gate terminal. P-channel IGFET P1230 may receive the output of inverter logic gate G1230 at a gate terminal. In this way, pass gate PG1220 may provide a controllable impedance path between the low limit detection signal LLD and down count signal DOWN in response to the output of NOR logic gate G1220.

Variable resistor VR1210 sets a resistance value in response to the state of temperature signals (Tp1-Tpn). In this way, the temperature window lower limit can be set.

IGFETs (P1210, P1230, N1220, and N1230) may be IGFETs including a plurality of vertically stacked horizontal channels as illustrated in FIGS. 3A, 3B, and 3C and may be formed in region 140 of integrated circuit device 100.

Figure 13:
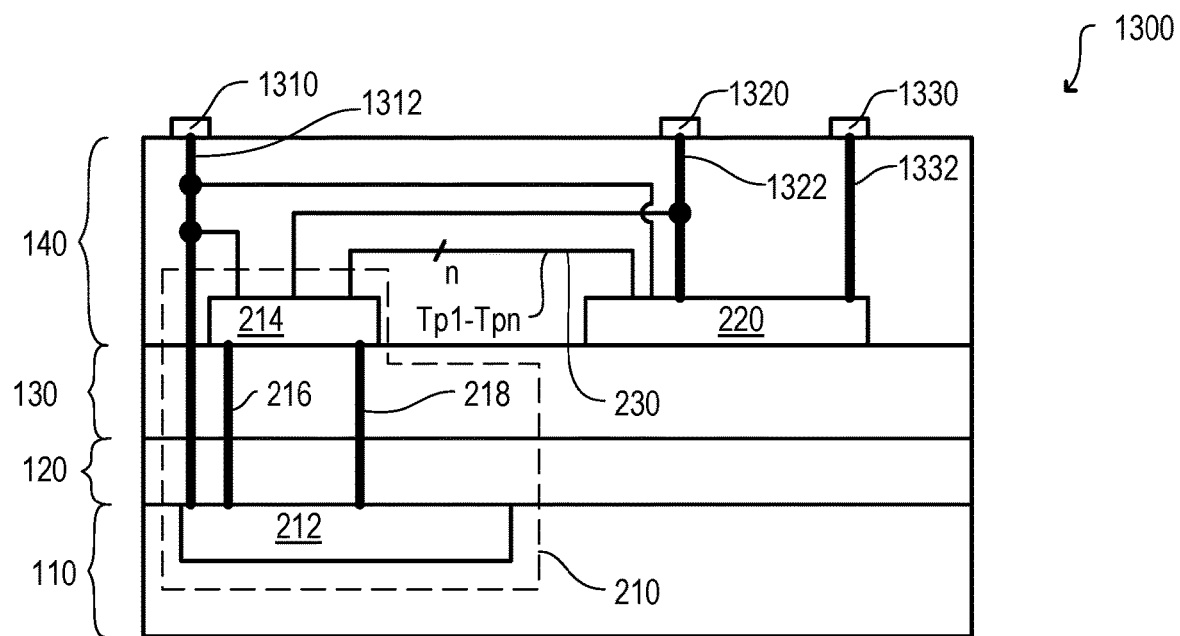
FIG. 13 is a schematic diagram of an integrated circuit device according to an embodiment.

Referring now to FIG. 13, an integrated circuit device according to an embodiment is set forth in a schematic diagram and given the general reference character 1300. Integrated circuit device 1300 can include the similar constituents as integrated circuit device 100 and integrated circuit device 200. Such constituents may be given the same reference character.

The circuit formed on integrated circuit device 1300 can include pads (1310, 1320, and 1330), temperature sensor circuit 210, and core circuitry 220. Pad 1310 can be electrically connected to temperature sensor circuit 210 and core circuitry 220 by way of interconnect wiring 1312. Pad 1320 can be electrically connected to temperature sensor circuit 210 and core circuitry 220 by way of interconnect wiring 1322. Pad 1330 can be electrically connected to core circuitry 220 by way of interconnect wiring 1332. Pad 1310 may receive a ground potential from external to integrated circuit device 1300. Pad 1320 may receive a power supply potential VDD from external to integrated circuit device 1300. Pad 1330 may receive/provide an external signal from/to external to integrated circuit device 1300. Examples of external signals can include address signals, data signals, and/or control signals as just a few examples. Signals may differ from power supply potentials in that they can toggle frequently between a first logic level and a second logic level instead of remaining essentially at one level for the duration of the operation of the device. Furthermore, a signal may differ from a power supply potential in that a signal may provide information to be used by integrated circuit device 1300 or provided from integrated circuit device 1300. Temperature sensor circuit 210 can provide temperature signals (Tp1 to Tpn) to core circuitry 220 by way of temperature signal bus 230. Temperature signal bus 230 may include n interconnect signal wirings.

Core circuitry 220 may be formed in region 140. However, temperature sensor circuit 210 may include a first circuit portion 212 formed in region 110 and a second circuit portion 214 formed in region 140. In this way, different technologies may be used to form the temperature senor circuit 210 without mixing technologies in region 140, which may be formed with state of the art cutting edge process technology and may be incompatible with the first circuit portion 212 of the temperature sensor circuit 210.

First circuit portion 212 may be electrically connected to second circuit portion 214 by way of interconnect wirings (216 and 218). Interconnect wirings (216 and 218) can be formed through regions (130 and 140) and may include vertical conductive vias.

Interconnect wiring 1312 can be formed through regions (140, 130, and 120) and may include vertical conductive vias as well as horizontally disposed conductive local interconnections. Interconnect wiring 1322 can be formed through region 140 may include vertical conductive vias as well as horizontally disposed conductive local interconnections. Interconnect wiring 1332 can be formed through region 140 may include at least one vertical conductive via.

Figure 14:
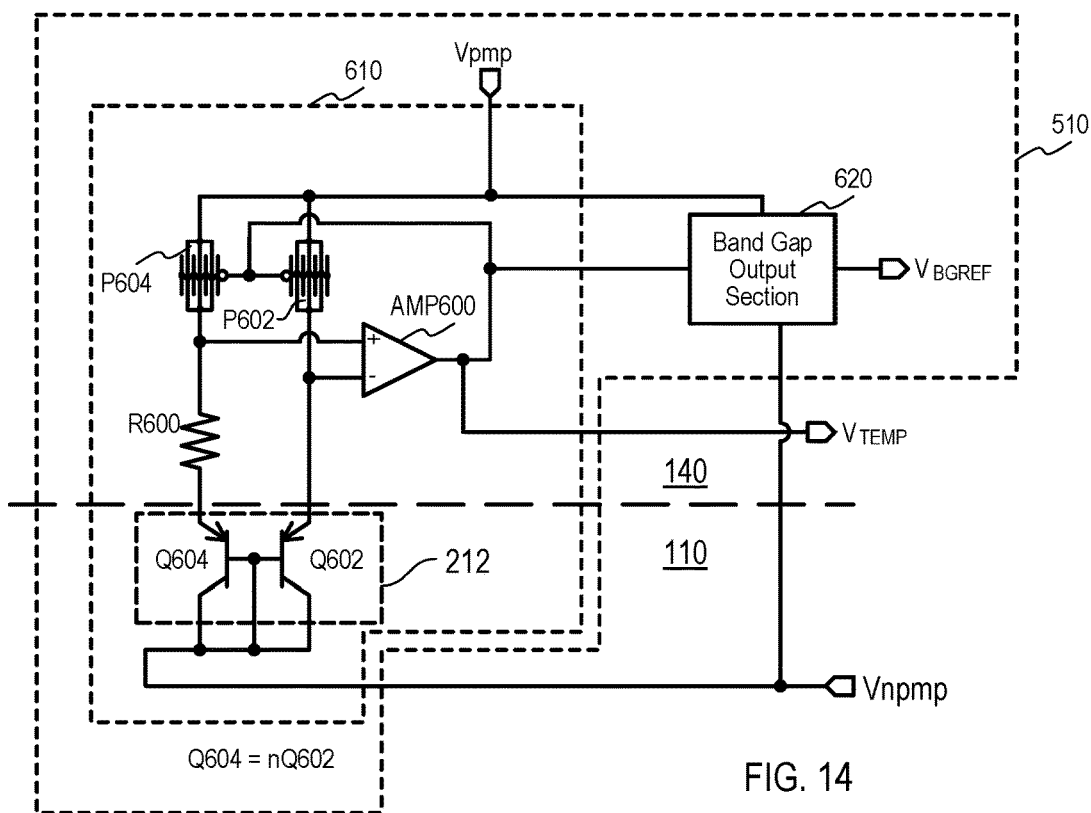
FIG. 14 is a circuit schematic diagram of a reference voltage generator according to an embodiment.

Referring now to FIG. 14, a reference voltage generator according to an embodiment is set forth in a circuit schematic diagram.

The reference voltage generator of FIG. 14 may include the same constituents as the reference voltage generator 510 of FIG. 6. The reference voltage generator of FIG. 14 may differ in that first circuit portion 212 of bandgap reference input section 610 may have transistors (P602 and P604) that have collector regions electrically connected to a negative boosted power supply voltage Vnpmp and band gap reference output section 620 may receive negative boosted power supply voltage Vnpmp.

By using a boosted power supply voltage Vnpmp that is negative with respect to a ground potential, temperature dependent reference voltage $V_{TEMP}$ and essentially temperature independent reference voltage $V_{BGREF}$ may have a low enough magnitude that step down circuits (530 and 540) (FIG. 5) may not be necessary. A band gap circuit may generate a band gap reference that is essentially about 1.25 volts or close to the theoretical band gap of silicon. However, when using a negative pumped voltage in the band gap voltage generation, the potential may be provided with a low enough magnitude to be in a proper operating range of circuitry including transistors that have channels that are vertically aligned and horizontally disposed and manufactured at deep sub-micron range without stressing and damaging the integrated circuit device.

Figure 15:
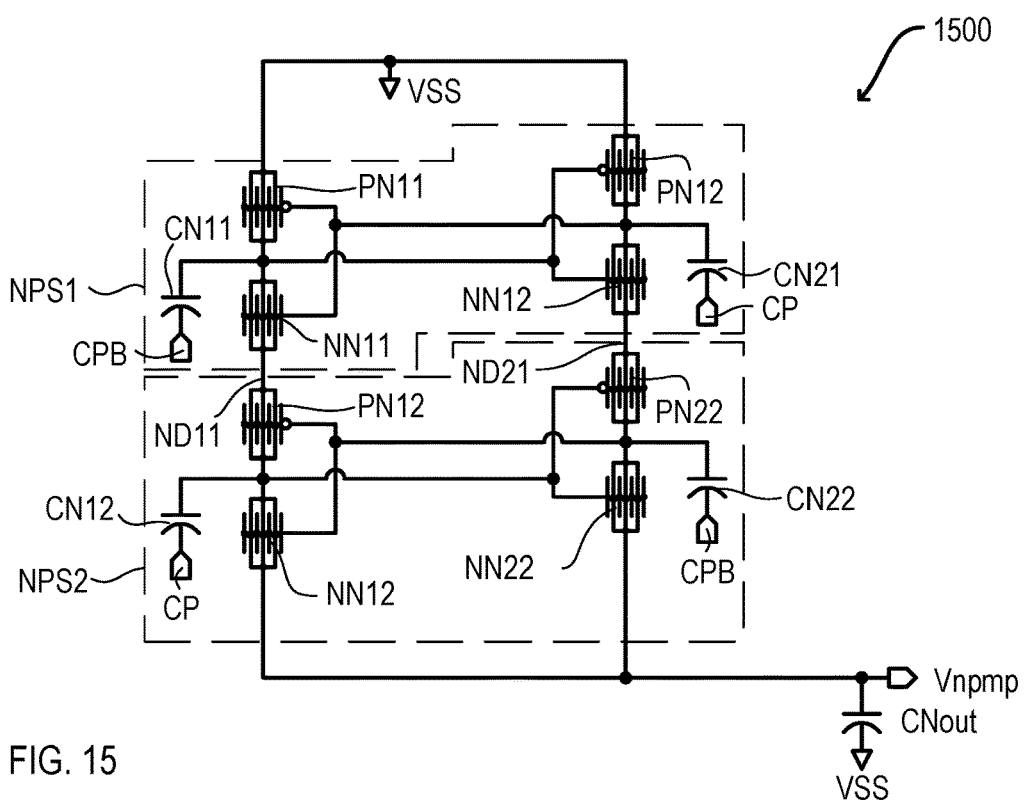
FIG. 15 is a circuit schematic diagram of a pump circuit according to an embodiment.

Referring now to FIG. 15, a circuit schematic diagram of a pump circuit according to an embodiment is set forth and given the general reference character 1500. Pump circuit 1500 may be used to generate the boosted power supply voltage Vnpmp. Boosted power supply voltage Vnpmp may be a negative voltage with respect to ground potential VSS.

Pump circuit 1500 may receive power supply potential VSS, a pump clock signal CP and a complementary pump clock signal CPB and may generate a boosted power supply potential Vnpmp.

Pump circuit 1500 may include pump circuit stages (NPS1 and NPS2). It is understood that more pump circuit stages may be added to provide a greater magnitude boosted power supply potential Vnpmp. Each pump circuit stage (NPS1 and NPS2) may increase the magnitude of boosted power supply potential Vnpmp by no more than about the power supply potential VDD more negative than the potential of the power supply potential VSS. For example, one pump circuit stage NPS1 would provide a boosted power supply potential Vnpmp of about negative of power supply potential VDD. Thus, 2 pump circuit stages (NPS1 and NPS2) may provide a boosted power supply potential Vnpmp no greater in magnitude than −2 times the potential of the power supply potential VDD. With a power supply potential of about 0.5 volts, pump circuit 1500 may provide a boosted power supply potential Vnpmp of essentially no greater in magnitude than about −1.0 volts.

Pump circuit stage NPS1 may receive pump clock signal CP, complementary pump clock signal CPB, and power supply potential VSS as inputs and may provide boosted potential outputs at terminals (ND11 and ND21). Pump circuit stage NPS1 may include n-type IGFETs (NN11 and NN21), p-type IGFETs (PNS11 and PNS21), and capacitors (CN11 and CN21). Capacitor CN11 may receive complementary pump clock signal CPB at a first terminal and may have a second terminal commonly connected to drain terminal of N-type IGFET NN11, drain terminal of p-type IGFET PNS11, gate terminal of n-type IGFET NN12, and gate terminal of p-type IGFET PN12. Capacitor C21 may receive pump clock signal CP at a first terminal and may have a second terminal commonly connected to drain terminal of N-type IGFET NN12, drain terminal of p-type IGFET PN12, gate terminal of n-type IGFET NN11, and gate terminal of p-type IGFET PN11. P-type IGFETs (PN11 and PN12) may have source terminals connected to receive power supply potential VSS. N-type IGFET NN11 may have a source terminal connected to provide a boosted potential output at terminal NN11. N-type IGFET NN12 may have a source terminal connected to provide a boosted potential output at terminal NN12.

Pump circuit stage NPS2 may receive pump clock signal CP and complementary pump clock signal CPB as inputs and may provide boosted power supply potential Vnpmp as an output. Pump circuit stage NPS2 may include n-type IGFETs (NN12 and NN22), p-type IGFETs (PN12 and PN22), and capacitors (CN12 and CN22). Capacitor CN12 may receive pump clock signal CP at a first terminal and may have a second terminal commonly connected to drain terminal of N-type IGFET NN12, drain terminal of p-type IGFET PN12, gate terminal of n-type IGFET NN22, and gate terminal of p-type IGFET PN22. Capacitor CN22 may receive complementary pump clock signal CPB at a first terminal and may have a second terminal commonly connected to drain terminal of N-type IGFET NN22, drain terminal of p-type IGFET PN22, gate terminal of n-type IGFET NN12, and gate terminal of p-type IGFET PN12. N-type IGFET NN12 and N-type IGFET NN22 may have source terminals commonly connected to provide boosted power supply potential Vnpmp at a first terminal of capacitor CNout. Capacitor CNout may have a second terminal electrically connected to power supply potential VSS.

All n-type IGFETs and p-type IGFETs in pump circuit 1500 are IGFETs that have a plurality of essentially vertically aligned and horizontally disposed channel regions. Pump circuit 1500 can produce a boosted power supply potential Vnpmp that have a magnitude that can be a multiple of power supply potential VDD without overstressing the gate insulating layers (320A and 320B (FIG. 3B and FIG. 3C) of the P-type IGFETs (PN11 to PN22) or N-type IGFETs (NN11 to NN22) in pump circuit 1500 by producing a gate to source/drain potential on each P-type IGFETs (PN11 to PN22) or N-type IGFETs (NN11 to NN22) that is no greater in magnitude than the power supply potential VDD.

Pump clock signal CP and complementary pump clock signal CPB can be complementary clock signals that have a predetermined frequency and period toggling between logic high and logic low. The predetermined frequency and period can be such that capacitors (CN11 to CN22) can be adequately charged and discharged to provide the desired boosted power supply potential Vnpmp.

Figure 16:
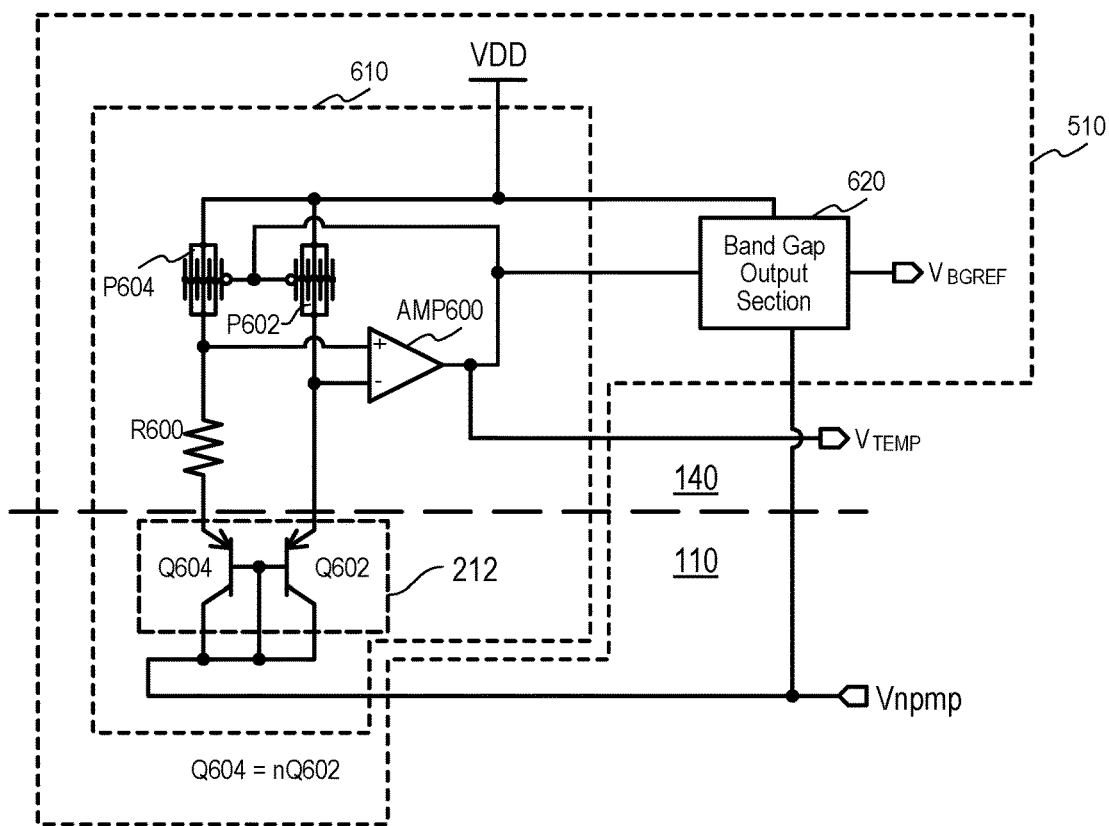
FIG. 16 is a circuit schematic diagram of a reference voltage generator according to an embodiment.

Referring now to FIG. 16, a reference voltage generator according to an embodiment is set forth in a circuit schematic diagram.

The reference voltage generator of FIG. 16 may include the same constituents as the reference voltage generator 510 of FIG. 6. The reference voltage generator of FIG. 16 may differ from the reference voltage generator of FIG. 6 in that first circuit portion 212 of bandgap reference input section 610 may have transistors (P602 and P604) that have collector regions electrically connected to a negative boosted power supply voltage Vnpmp and band gap reference output section 620 may receive negative boosted power supply voltage Vnpmp. The reference voltage generator of FIG. 16 may also differ from the reference voltage generator of FIG. 6 in that IGFETs (P604 and P602) of bandgap reference input section 610 may each have a source terminal electrically connected to power supply voltage VDD and band gap reference output section 620 may also receive power supply voltage VDD. Power supply voltage VDD may be provided from external to integrated circuit device 100.

By using a boosted power supply voltage Vnpmp that is negative with respect to a ground potential, temperature dependent reference voltage $V_{TEMP}$ and essentially temperature independent reference voltage $V_{BGREF}$ may have a low enough magnitude that step down circuits (530 and 540) (FIG. 5) may not be necessary. Without step down circuits (530 and 540), temperature dependent reference voltage $V_{TEMP}$ and essentially temperature independent reference voltage $V_{BGREF}$ may be connected directly to temperature output circuit 550 (FIG. 5). A band gap circuit may generate a band gap reference that is essentially about 1.25 volts or close to the theoretical band gap of silicon. However, when using a negative pumped voltage in the band gap voltage generation, the potential may be provided with a low enough magnitude to be in a proper operating range of circuitry including transistors that have channels that are vertically aligned and horizontally disposed and manufactured at deep sub-micron range without stressing and damaging the integrated circuit device.

Figure 17:
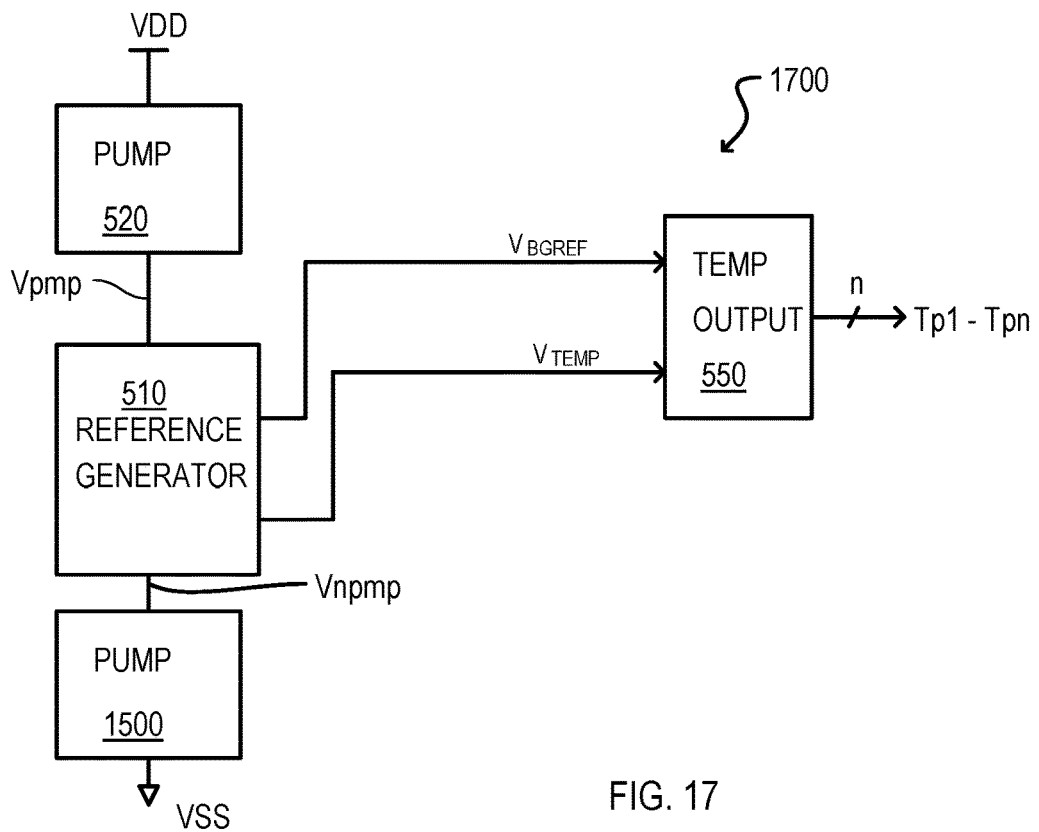
FIG. 17 is a block schematic diagram of a temperature sensor circuit according to an embodiment.

Referring now to FIG. 17, a block schematic diagram of a temperature sensor circuit according to an embodiment is set forth and given the general reference character 1700. Temperature sensor circuit 1700 may correspond to temperature sensor circuit 210 in integrated circuit device 200 of FIG. 2. Temperature sensor circuit 1700 may have similar constituents as temperature sensor circuit 500 of FIG. 5 and such constituents may have the same reference character.

Temperature sensor circuit 1700 may differ from temperature sensor circuit 500 in that a pump circuit 1500 can generate a boosted power supply potential Vnpmp electrically connected to reference generator 510 so that reference voltage $V_{BGREF}$ and temperature dependent reference voltage $V_{TEMP}$ may be electrically connected directly to temperature output circuit 550 without the necessity of step down circuits (530 and 540) (FIG. 5).

Figure 18:
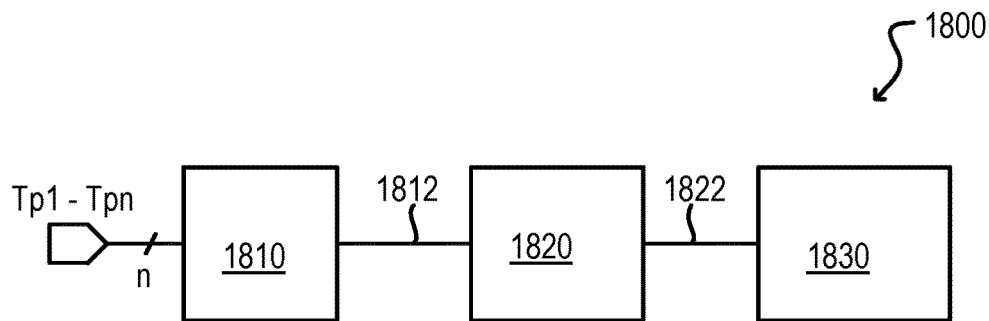
FIG. 18 is a block schematic diagram of core circuitry according to an embodiment.

Referring now to FIG. 18, a block schematic diagram of core circuitry is set forth according to an embodiment and given the general reference character 1800.

Core circuitry 1800 can correspond to core circuitry 220 of FIG. 2.

Core circuitry 1800 can include a refresh control circuit 1810, a refresh circuit 1820, and a dynamic random access memory array 1830. Refresh control circuit 1810 can receive temperature signals Tp1-Tpn and provide a refresh frequency control signal 1812. Refresh circuit 1820 can receive refresh frequency control signal 1812 and may provide a refresh signal 1822 at a frequency rate in accordance with the state of the at least one refresh frequency control signal. Dynamic random access memory array 1830 may receive the refresh signal which in conjunction with the state of an address counter (not shown) can refresh a row of dynamic random access memory cells. In this way, the refresh rate can be changed in response to the state of temperature signals Tp1-Tpn indicating the temperature window in which the integrated circuit device is operating.

Core circuitry 1800 may be used in the integrated circuit device when the integrated circuit device includes dynamic random access memory cells, which must be refreshed for data preservation.

Figure 19:
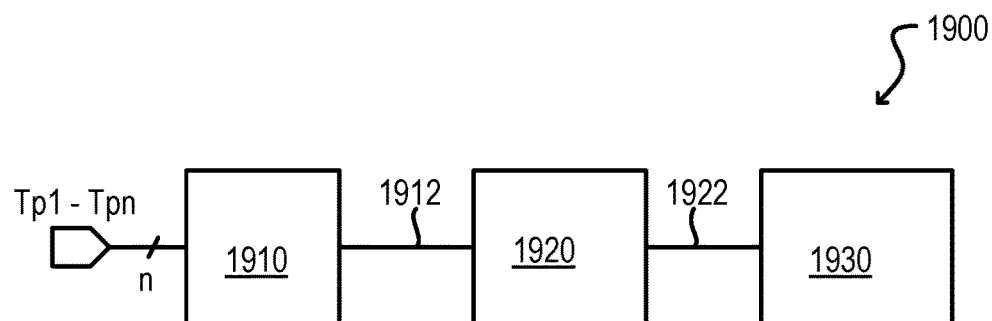
FIG. 19 is a block schematic diagram of core circuitry according to an embodiment.

Referring now to FIG. 19, a block schematic diagram of core circuitry is set forth according to an embodiment and given the general reference character 1900.

Core circuitry 1900 can correspond to core circuitry 220 of FIG. 2.

Core circuitry 1900 can include a clock frequency control circuit 1910, a clock circuit 1920, and a processor circuit 1930. Clock frequency control circuit 1910 can receive temperature signals Tp1-Tpn and provide at least one clock frequency control signal 1912. Clock circuit 1920 can receive clock frequency control signal 1912 and may provide a clock signal 1922 at a frequency rate in accordance with the state of the at least one clock frequency control signal. Processor circuit 1930 may receive the clock signal 1922 which provides a clocking frequency for processor circuitry that can be changed in response to the state of temperature signals Tp1-Tpn indicating the temperature window in which the integrated circuit device is operating.

Core circuitry 1900 may be used in the integrated circuit device when the integrated circuit device includes processor circuits, such as in a microprocessor device.

Figure 20:
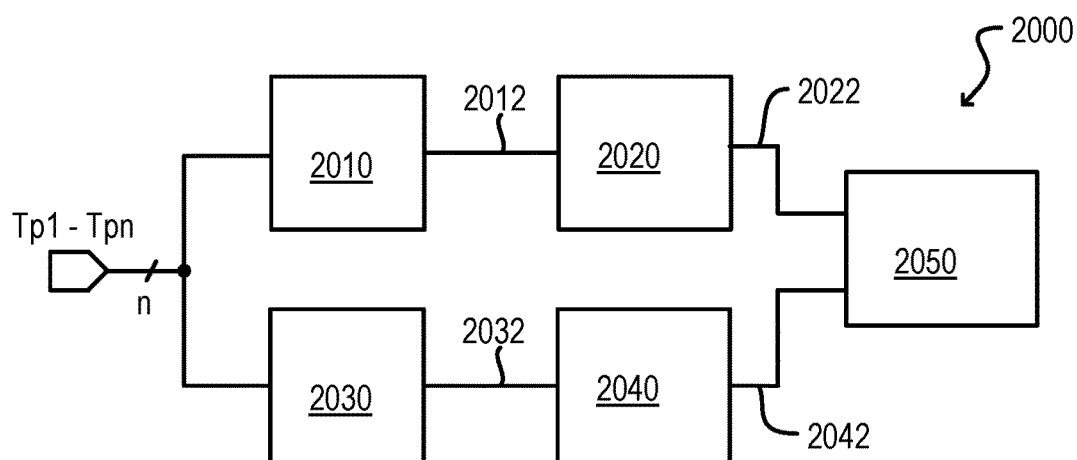
FIG. 20 is a block schematic diagram of core circuitry according to an embodiment.

Referring now to FIG. 20, a block schematic diagram of core circuitry is set forth according to an embodiment and given the general reference character 2000.

Core circuitry 2000 can correspond to core circuitry 220 of FIG. 2.

Core circuitry 2000 can include a read assist control circuit 2010, a write assist control circuit 2030, a read assist circuit 2020, a write assist circuit 2040, and a static random access memory array 2050. Read assist control circuit 2010 can receive temperature signals Tp1-Tpn and provide at least one read assist enable signal 2012. Read assist circuit 2020 can receive the at least one read assist enable signal 2012 and may provide read assist signal 2022 during a read operation when read assist signal 2012 has an enable logic level. Write assist control circuit 2030 can receive temperature signals Tp1-Tpn and provide at least one write assist enable signal 2032. Write assist circuit 2040 can receive the at least one write assist enable signal 2032 and may provide a write assist signal 2042 during a read operation when read assist signal 2032 has an enable logic level. Static random access memory array 2050 may receive the read assist signal 2022 and write assist signal 2040. Static random access memory array 2050 may modify the read operation when read assist signal 2022 has a read assist logic level and may not modify the read operation when read assist signal 2022 has a normal read logic level. Static random access memory array 2050 may modify the write operation when write assist signal 2042 has a write assist logic level and may not modify the read operation when read assist signal 2042 has a normal write logic level. Read and/or write assist modifications may include changing the bit line potential, word line potential, and/or static random access memory cell power supply potential during a read or write operation to a static random access memory cell, as just a few examples.

Core circuitry 2000 may be used in the integrated circuit device when the integrated circuit device includes static random access memory cells.

Integrated circuit devices (100 and 1300) may be contiguous structures, such that, regions may be deposited or bonded in a semiconductor fabrication facility and preferably all formed on a contiguous wafer in a multiple of units and then separated before packaged or set in a multi-chip package. For example, regions (110, 120, 130, and 140) may be contiguous regions with virtually no separation other than a region border formed by a change of materials. Bonding of regions may be performed using wafer to wafer bonding, for example region 110 may be formed on a first semiconductor wafer and regions (120, 130, and 140) may be formed on a second semiconductor wafer, then the first and second wafer may be bonded using a wafer to wafer bonding technique followed by dicing and packaging to form the integrated circuit device. Alternatively, region 110 may be formed on a first semiconductor wafer and regions (120, 130, and 140) may be formed on a second semiconductor wafer, then either the first or second wafer may be diced and a die pick and place may be used to place dies on the first or second intact wafer, followed by dicing and packaging to form the integrated circuit device.

It is understood that the term pad may be any circuit connection that is electrically connected to provide or receive a signal or a potential externally to the integrated circuit device.

Electrically connected can be a connection through a wiring other passive component such as a resistor.

Transistors such as IGFETs, diodes (p-n junctions), and BJTs may be considered active circuit elements, while other circuit elements such as interconnections (i.e. wirings), resistors, inductors, and capacitors may be considered passive circuit elements.

A voltage may be expressed as a potential.

A signal can be a data or control signal that can transition between logic levels, as just a few examples. A signal is not a power supply potential used to provide power to circuitry.

Other electrical apparatus other than semiconductor devices may benefit from the invention.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. An integrated circuit device, including:
   a first region;
   a second region formed over the first region, the first and the second regions coupled by at least one other contiguous region; and
   a temperature sensor circuit including a first portion formed in the first region and a second portion formed in the second region, the second portion including at least one insulated gate field effect transistor (IGFET) formed in the second region, the at least one IGFET including a plurality channels disposed substantially in a first direction and are substantially aligned in a second direction substantially perpendicular to the first direction and having a control gate that substantially surrounds the plurality of channels, the plurality of channels provide a controllable impedance path between a first source/drain terminal and a second source/drain terminal, the second source/drain terminal of the at least one IGFET is coupled to the first portion of the temperature sensor circuit.

2. The integrated circuit device of claim 1, wherein:
   the first portion of the temperature sensor circuit includes a first active circuit component coupled to the first source/drain terminal of the at least one IGFET.

3. The integrated circuit device of claim 2, wherein:
   the first active circuit component is a diode, the diode having an anode terminal coupled to the first source/drain terminal of the at least one IGFET.

4. The integrated circuit device of claim 3, wherein:
   the diode is a p-n junction diode.

5. The integrated circuit device of claim 1, further including:
   the temperature sensor circuit provides at least one temperature signal, the at least one temperature signal indicates temperature window in which the integrated circuit device currently operates.

6. The integrated circuit device of claim 5, further including:
   a power up circuit, the power up circuit provides a power up signal having a power up logic level in response to detecting power received by the integrated circuit device, the control circuit coupled to receive the power up signal and provide a predetermined state to the at least one temperature signal.

7. The integrated circuit device of claim 5, further including:
   core circuitry formed in the second region, the core circuitry coupled to receive the at least one temperature signal.

8. The integrated circuit device of claim 7, further including:
   the core circuitry includes a clock circuit coupled to receive the at least one temperature signal, the clock circuit provides a clock signal having a frequency based on a logic state of the at least one temperature signal.

9. The integrated circuit device of claim 8, wherein:
   the core circuitry includes a processor circuit coupled to receive the clock signal.

10. The integrated circuit device of claim 1, wherein:
    the temperature sensor circuit provides a plurality of temperature signals, the plurality of temperature signals indicate a temperature window in which the integrated circuit device currently operates.

11. The integrated circuit device of claim 10, further including:
    a power up circuit, the power up circuit provides a power up signal having a power up logic level in response to detecting power received by the integrated circuit device, the control circuit coupled to receive the power up signal and provide a predetermined state to the plurality of temperature signals.

12. The integrated circuit device of claim 10, further including:
    core circuitry formed in the second region, the core circuitry coupled to receive the plurality of temperature signals.

13. The integrated circuit device of claim 12, wherein:
    the core circuitry includes a clock circuit coupled to receive the plurality of temperature signals, the clock circuit provides a clock signal having a frequency based on a logic state of the plurality of temperature signals.

14. The integrated circuit device of claim 13, wherein:
    the core circuitry includes a processor circuit coupled to receive the clock signal.

15. The integrated circuit device of claim 1, wherein:
    the control gate of the at least one IGFET is coupled to receive a reference voltage.

16. The integrated circuit device of claim 1, wherein:
    the integrated circuit device is a static random access memory device.

17. The integrated circuit device of claim 1, wherein:
    the integrated circuit device is a processor device.

18. The integrated circuit device of claim 1, further including:
    the control gate of the at least one IGFET contiguously surrounds the plurality of channels.

19. The integrated circuit device of claim 1, wherein:
    the first region is contiguously coupled to the second region.

20. The integrated circuit device of claim 1, wherein:
    the at least one IGFET has a gate length of less than about 10 nm.

* * * * *